(12) United States Patent
Wakui et al.

(10) Patent No.: US 6,809,300 B2
(45) Date of Patent: Oct. 26, 2004

(54) TEMPERATURE ADJUSTING SYSTEM IN EXPOSURE APPARATUS

(75) Inventors: Shinji Wakui, Komae (JP); Yoshinori Makita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 10/261,651

(22) Filed: Oct. 2, 2002

(65) Prior Publication Data

US 2003/0111458 A1 Jun. 19, 2003

(30) Foreign Application Priority Data

Oct. 3, 2001 (JP) ........................................ 2001/307730

(51) Int. Cl.[7] .................................................. H05B 1/02
(52) U.S. Cl. ................................................... 219/494
(58) Field of Search ............................. 219/494, 497; 392/379–385, 360, 485, 488–489; 156/497, 499; 438/5, 14

(56) References Cited

U.S. PATENT DOCUMENTS

| | | | | |
|---|---|---|---|---|
| 4,195,415 A | * | 4/1980 | Livings et al. | 34/549 |
| 5,019,994 A | * | 5/1991 | Rainville | 700/208 |
| 5,367,787 A | * | 11/1994 | Ikeda et al. | 34/549 |
| 5,494,097 A | * | 2/1996 | Straub et al. | 165/288 |
| 6,665,492 B1 | * | 12/2003 | Garcia et al. | 392/383 |

FOREIGN PATENT DOCUMENTS

| | | | |
|---|---|---|---|
| EP | 648992 | * | 4/1995 |
| JP | 9-115647 | * | 5/1997 |
| JP | 2000-187514 | | 7/2000 |

* cited by examiner

Primary Examiner—John Jeffery
(74) Attorney, Agent, or Firm—Fitzpatrick, Cella, Harper & Scinto

(57) ABSTRACT

In a temperature adjusting system, a first temperature measuring unit measures the temperature at a blowing outlet port supplying a temperature control space with a medium and a first temperature controller provides compensation responsive to the first measured temperature. A second temperature measuring unit measures the temperature of the temperature control space downstream of the blowing outlet port and a second temperature controller provides compensation responsive to second measured temperature. A temperature converting unit controls heat generation on the basis of the first temperature controller output to control the medium at the constant temperature supplied from the blowing outlet port. A set predetermined temperature corresponding to a desired value for the temperature in the temperature control space is input to the second temperature controller and the second temperature controller output is input as a temperature value to the first temperature controller.

19 Claims, 19 Drawing Sheets

TIME

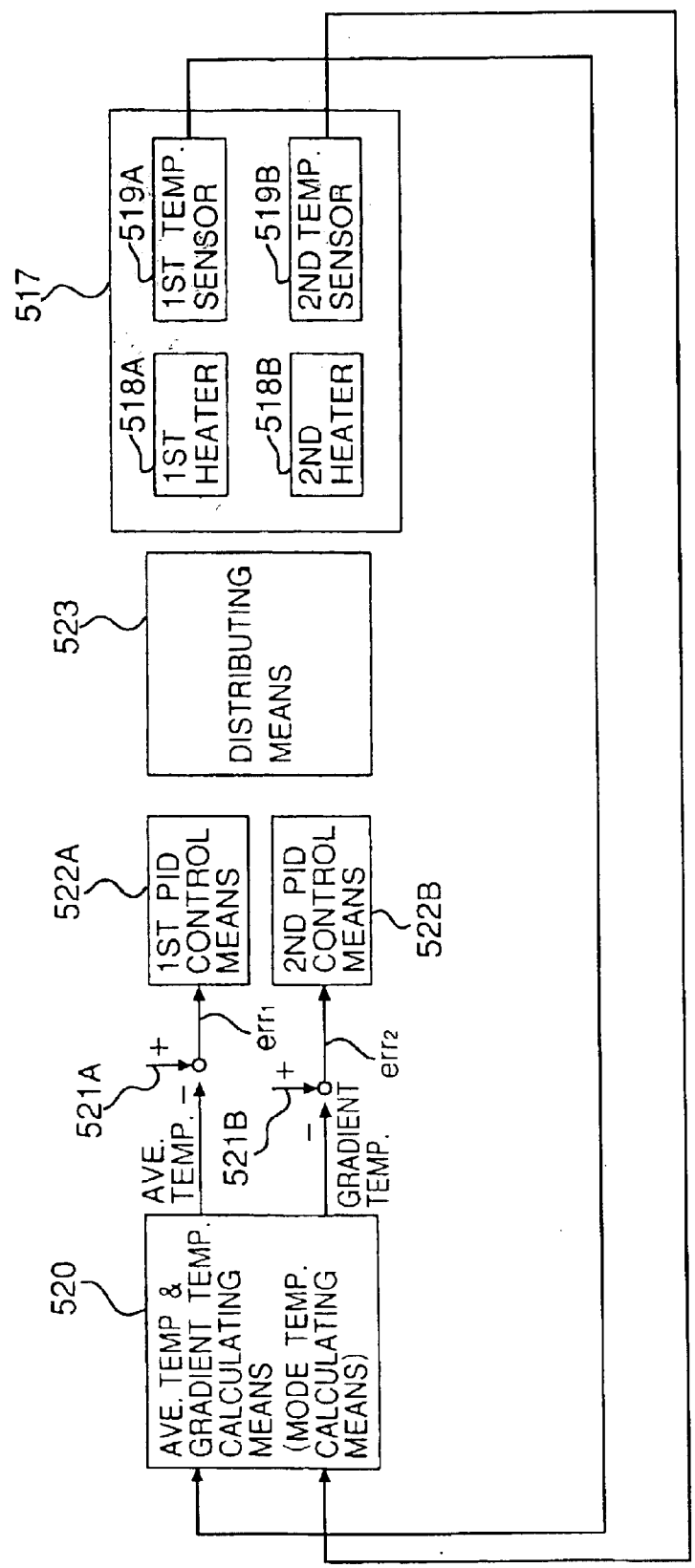
FIG. 19 *PRIOR ART*

TEMPERATURE ADJUSTING SYSTEM IN EXPOSURE APPARATUS

FIELD OF THE INVENTION AND RELATED ART

This invention relates generally to a temperature adjusting system for adjusting temperature of a predetermined space by controlling temperature of a medium such as a gas, fluid or solid, for example. More particularly, the invention concerns a non-interference type temperature adjusting control system, and an exposure apparatus having such a control system.

An apparatus for reducing a circuit pattern formed on an original, such as a reticle through a projection optical system and for transferring the same to a substrate such as a semiconductor wafer, is called a semiconductor exposure apparatus. Usually, it is called a stepper. Recently, a semiconductor exposure apparatus in which an exposure process is carried out by moving a reticle stage carrying thereon a reticle and a wafer stage carrying thereon a semiconductor wafer, in opposite directions in synchronism with each other, and at a predetermined speed ratio, has been developed, and it is called a scanner. In such semiconductor exposure apparatuses, the apparatus structure as a whole is accommodated in a temperature controlled chamber.

In recent years, in order to meet requirements for improved productivity of an exposure apparatus, such as a semiconductor exposure apparatus, positioning mechanisms such as an original stage (e.g., a reticle stage) and a substrate stage (e.g., a wafer stage), for example, are made to be driven at higher speeds. This causes increased heat generation in actuators for driving these stages. It disturbs the light path of an interferometer used for the positioning of the stage and, consequently, it results in deterioration of the positioning precision. Further, since heat generation causes expansion/contraction in size of various structural components, this deteriorates the measurement precision. For these reasons, improvements in precision of temperature control for a chamber for accommodating an exposure apparatus have been desired.

Conventionally, in order to keep a predetermined temperature inside a chamber, a gas is once cooled and then it is re-heated by using a temperature adjuster. After a desired temperature is reached, the gas is supplied into a space where a constant temperature is to be maintained. Here, the gas may be air, nitrogen gas, or helium, for example. Now, air is taken as an example of an operative gas. However, the following description applies to nitrogen gas or helium as an operative gas.

First, referring to FIG. 14, a conventional temperature control system will be explained. FIG. 14 shows a structure of a temperature control system of a known type, wherein denoted at 501 is an air blower for discharging air cooled by a cooling unit (not shown), and denoted at 502 is a re-heating heater for re-heating the air supplied from the blower 501. Denoted at 503 is a duct for introducing the re-heated air, and denoted at 504 is temperature measuring means for measuring the temperature at an air blowing outlet port. Denoted at 505 is temperature controlled air, and denoted at 506 is a temperature controlled space, which depicts an approximate space where the temperature is going to be controlled. This space 506 accommodates therein a stage 507 as a positioning mechanism of a semiconductor exposure apparatus, and a laser interferometer 508 as position measuring means for positioning control of the stage 507.

In the temperature controlled space 506, since the stage 507 is driven with acceleration and deceleration at high speeds, heat is generated by actuators, not shown. This causes deviation of the temperature inside the space 506 from a predetermined value. The temperature measuring means 504 measures the temperature of the air at the air blow outlet port, and an output thereof is applied to a temperature controller 509 whereby an appropriate compensation signal is produced. This compensation signal is applied as an input to a driver 510 for controlling the amount of voltage application to the re-heating heater 502, such that the voltage application to the heater 502 is controlled and, thus, the heating amount to the cool air supplied from the blower 501 is controlled. As a result, air being controlled to a constant temperature can be supplied into the space 506 from the air blow outlet port. The temperature controller 509 can be used for temperature control in a plant, for example, and it has a function for mainly accomplishing PID compensation wherein, as well known in the art, P means proportion, I means integration and D means differentiation.

The temperature controlling system shown in FIG. 14 is based on such a concept that temperature controlled air 505 should be produced and the space 506 should be filled with the same. There is a heat generating source inside the space 506 as an external disturbance factor, and it may cause deviation of the temperature inside the space 506 from a desired temperature. Since, however, the temperature measuring means 504 is hidden inside the duct 503 rather than being exposed in the space 506, the temperature measuring means 504 does not sense a temperature change inside the space 506 immediately. Namely, in this system, air 505 having been controlled at a designated temperature is consistently supplied into the temperature-deviated space 506, thereby to correct the deviated temperature. In other words, the space 506 is controlled at a designated temperature by substituting the air inside the space 506, having a temperature deviated from a desired temperature, by air having been temperature controlled and kept at a designated temperature. Thus, it should be noted that in the structure of FIG. 14 the space 506 is not directly temperature controlled. Any external disturbance produced inside the space 506 is never directly detected, and it means that the function for suppressing a temperature change due to external disturbance is very poor. For this very reason, conventionally, an additional mechanical structure, such as a shield for encircling the space 506, is used to prevent external disturbance from entering the space 506.

For better understanding of the above, an analogy is introduced here. FIG. 15 shows a mechanical system in which, by driving a motor 511, an inertial load 513 connected thereto through a spring 512 is rotationally driven. This mechanical system is functionally equivalent to the temperature control system described above.

In FIG. 15, the motor 511 is controlled on the basis of an output of a sensor 514. More specifically, in terms of a rotational speed or rotational displacement, the state of the motor 511 is detected, and the detection result is fed back to a controller 515. Thus, while the motor shaft may be controlled accurately, the inertial load 513 connected to the motor through the spring 512 is left uncontrolled. Therefore, even if a torque external disturbance 516 is applied to the inertial load 513 and the rotational speed or rotational displacement of the inertial load 513 changes, it is possible that the rotational speed or rotational displacement at the motor 511 side is unchanged.

The temperature controlling structure shown in FIG. 14 can be regarded as being an equivalent to this. Specifically, the state detection at the motor 511 side by the sensor 514 corresponds to the temperature detection at the air blow outlet port by the temperature measuring means 504, and the torque external disturbance applied to the inertial load 513 corresponds to the external disturbance entering the space 506. Therefore, as in the case of FIG. 15, wherein the rotational speed or displacement of the inertial load 513 may change relative to the motor 511 shaft in response to the torque external disturbance applied to the inertial load 513, it is clear in FIG. 14 that, when external disturbance influences the space 506, the temperature in the space changes relative to the air temperature as controlled at the location of the temperature measuring means 504. Although the temperature of the air at the air blow outlet port of the duct 503 is controlled in this system, what is to be the duly controlled constant is the temperature inside the space after the air blow outlet port. Yet, there are various external disturbances, which may cause deviation of the set temperature. Nevertheless, in the conventional temperature controlling system, the temperature of the space 506, which is inherently to be temperature-controlled, is not measured. Quite naturally, the temperature of the space 506, itself, is not controlled positively.

If the temperature of the space 506 is measured and it is fed back to control the re-heating heater 502, the temperature control of the space 506 may be complete. Practically, however, feedback stabilization and temperature controller 509 tuning to ensure satisfactory suppression of external disturbances are absolutely difficult to accomplish. This is because of the following reasons. Comparing the distance from the re-heating heater 502 to some temperature measuring means to be provided inside the space 506 with the distance from the same re-heating heater 502 to the temperature measuring means 504 disposed adjacent to the air blow outlet port, clearly the former is longer and, thus, dead time is inevitably longer in the former, causing the temperature controllability to worsen. Further, since the temperature of the space 506 fluctuates due to the influence of external disturbances, it is readily understood that stabilization of a closed loop system based on feedback of varying measured values is not easy. For these reasons, conventionally, temperature measurement has to be carried out at a position not directly influenced by external disturbance, for example, the air blow outlet port covered by the duct 503, and, by feeding back the measured value, temperature control is performed.

However, what is to be just controlled to be constant is the very temperature of the space 506 being exposed to external disturbances. In order to meet requirements for further device miniaturization and improved productivity of a semiconductor exposure apparatus, a temperature control system capable of directly controlling the temperature of a space, such as the temperature controlled space 506, has been desired.

FIG. 16 is a schematic view for explaining a conventional air conditioning unit. Denoted in the drawing at 21 is a thermostatic chamber, and denoted at 22 is an exposure apparatus disposed inside the chamber 21. Denoted at 23 is a booth. Adjacent to the booth 23, there is an air conditioning passageway 24 for supplying a gas of a predetermined set temperature. From this air conditioning passageway 24 and through a filter 25, a gas is blown into the booth 23 to thereby keep the booth 23 clean and at a constant temperature. Disposed along the air conditioning passageway 24 is an air conditioning unit 29, which includes a heat exchanger 26, a blower 27 and a re-heater 28. Also, there are an external air introducing inlet port 30 for introducing external air, a communication port 31 being communicated with the booth 23, and a gas discharging outlet port 32 for discharging the gas inside the booth 23 outwardly.

Major components placed in the booth 23 will now be explained. In the following description, the words "air conditioning" and "temperature controlling" or "temperature adjusting" will be used equivalently. First, light emitted from a light source (not shown) is projected on a reticle 33 having a circuit pattern for production of semiconductor devices. Light passed through the reticle goes through a projection optical system 34 and, while being reduced to ⅕ or ¼ thereby, it is projected onto a semiconductor wafer 35. The wafer 35 is placed on a wafer stage (X-Y stage) 36. The wafer stage 36 is mounted on an anti-vibration table 37. Denoted at 38 are active mounts, constituting an active anti-vibration system. The function of this unit is to suppress vibration of the major assembly structure including the anti-vibration table 37, to be produced by drive reaction forces resulting from step-and-repeat motion or high-speed scan motion of the wafer stage, accompanied by sudden acceleration and deceleration. Also, it has a function to prevent vibration of the floor on which the exposure apparatus 22 is placed, from being transmitted to the major assembly structure including the projection optical system 34.

As regards the temperature inside the booth 23, temperature measuring means 39a detects a temperature near the exit of the filter 25. The detection output thereof is applied to a controller 40. In most cases, the controller 40 performs a PID compensation operation to a differential signal, which is produced by comparing a target temperature set in the controller 40 and the result of measurement by the temperature measuring means 39a. The compensation output is applied as an input to a re-heater 28 (hereinafter, "temperature converting means"), including a re-heating heater 2 and a driver (e.g., solid state relay SSR) for supplying an electric voltage to the heater. In response, the voltage application to the heater 2 is adjusted so that the temperature becomes equal to the target temperature set in the controller 40. What is described above with reference to FIG. 16 is a general structure of an air circulation passageway and a temperature control system, for controlling the booth 23 approximately to be at a constant temperature.

Practically, in addition to the temperature control on the basis of an output of the temperature measuring means 39a, separate air conditioning means is provided independently. For example, in relation to the spaces related to the projection optical system 34, the wafer stage 36, and a reticle stage (not shown) for positioning the reticle 33, and so on, respectively, temperature control is carried out locally and concentratedly to these spaces. In most cases, the temperature control is carried out by supplying a gas being controlled at a constant temperature into each space. Only an output of temperature measuring means provided at the air blow outlet port is fed back. This type of temperature control will hereinafter be referred to as "blower outlet control".

However, the space just to be controlled at a constant temperature is after the blowing outlet port, and external disturbances are present there. What can be called "use point control," which is based on temperature measurement to a space just to be temperature controlled, has never been carried out.

Now, a performance comparison will be made to the blower outlet control and the use point control. FIGS. 17A–17C show results of measurements actually made to the blower outlet control, wherein FIG. 17A shows the use point temperature (it is only monitored), FIG. 17B shows the blowing outlet port temperature, and FIG. 17C shows the temperature of an external disturbance source. In response to application of an external disturbance, such as shown in FIG. 17C, the blowing outlet port temperature changes for a moment. However, in this structure, basically, the temperature measuring means provided at the blowing outlet port does not sense a temperature change at a use point. Therefore, after a flash change at the moment of external disturbance application, it continues the supply of air at the designated temperature. Yet, the temperature at the use point is left deviated due to the external disturbance, as long as it is within the time span as illustrated in the drawing.

On the other hand, FIGS. 18A–18C show the results of measurements actually made to the use point control, wherein temperatures shown in FIGS. 18A–18C correspond to the temperatures of FIGS. 17A–17C, respectively. In this case, in response to external disturbance application, such as shown in FIG. 18C, the temperature of the gas from the blowing outlet port (FIG. 18B) changes. It is seen that, by supplying temperature-changed gases from the blowing outlet port, the influence of the external disturbance is cancelled and, as shown in FIG. 18A, the temperature at the use point is turned quickly back to the designated temperature.

It is seen that, with the use point temperature control, as compared with blower outlet control, the temperature of the space, which is just to be temperature controlled, can be controlled at a high precision. At least when the exposure apparatus is in a normal operation state and the thermostatic chamber is steadily operated, clearly, the use point control is superior.

However, for example, if the gas-tightness of the thermostatic chamber of an exposure apparatus is interrupted by opening a door of the chamber, continuous operation of the use point control will cause a malfunction and, in a worst case, stoppage of the thermostatic chamber operation. The reason is that, as compared with the temperature control for a closed space (as a thermostatic chamber), a temperature change to be applied from outside of the chamber is continuous and overwhelming, and it goes beyond the capacity of the temperature converting means for conditioning the chamber. While it depends on the level of changed temperature, it is possible that the temperature converting means continuously produces a null output or maximum output. Also, if a limiter is set for the output of the temperature converting means, the output may be fixed to the upper or lower limit thereof.

In the case of blower output control, on the other hand, if the door of the thermostatic chamber is opened, the temperature adjacent to the use point may be disturbed, whereas the temperature at the blowing outlet port may not be disturbed. Thus, even if the temperature around the use point goes away from the designated temperature to cause a substantial error, adversely affecting the exposure performance, the temperature control with regard to the blowing outlet port can be continued as if there is no change by the external disturbance. In other words, without causing abnormal heating of the temperature converting means, for example, or without causing stoppage of the thermostatic chamber, the operation can be kept stable. Then, if the door of the thermostatic chamber is closed, since the gas from the blowing outlet port is at a constant temperature, after an elapse of quite a long time, the temperature at the use point also turns back to the predetermined temperature.

In the structure of FIG. 16, in connection with the spaces related to the projection optical system 34, the wafer stage 36, and a reticle stage (not shown) for positioning the reticle 33, respectively, temperature control is carried out locally and concentratedly to each of them. The exposure apparatus 22 operates while operating these local air conditioning systems in parallel.

Conventionally, such local air conditioning systems in an aggregation are operated in parallel to each other. A large technical problem is involved in this respect. Idealistically, local air conditioning systems should operate as mutually independent systems, without affecting each other. Practically, however, the local air conditioning systems interfere with each other. For example, adjustment made to improve a certain local air conditioning system may act as an external disturbance to another local air conditioning system. It is, therefore, difficult to improve the temperature controllability of the thermostatic chamber, as a whole.

Japanese Laid-Open Patent Application No. 2000-187514 proposes a structure for avoiding such interference in a temperature control system. FIG. 19 shows a non-interference temperature control system with a dual-input and dual-output temperature adjuster, based on this proposal.

Denoted in the drawing at 517 is a temperature adjusting system, which comprises first and second heaters 518A and 518B (temperature converting means), and first and second temperature sensors 519A and 519B (temperature measuring means).

The outputs of the first and second temperature sensors 519A and 519B are applied to average temperature and gradient temperature calculating means 520 (hereinafter, "mode temperature calculating means"), in which an average temperature and a gradient temperature are calculated on the basis of the outputs of the sensors 519A and 519B. The average temperature and the gradient temperature are compared with values applied to target value input terminals 521A and 521B, respectively, whereby deviation signals err1 and err2 are produced. These signals are applied to first PID control means 522A and second PID control means 522B, respectively, whereby a control input is calculated.

The outputs of the first and second PID control means 522A and 522B are applied to distributing means 523, by which control inputs to be produced by the first and second heaters 518A and 518B, disposed spatially separately, are determined.

Viewing it in perspective, the system structure of FIG. 19 can be regarded as being a control system for mode control. For example, in the field of machine control, a control loop structure based on a kinetic mode for translation and rotation will be similar to such as shown in FIG. 19. This is not limited to the kinetic mode. A control loop structure based on a vibration mode for individually defining a vibration mode of a mechanical system (controlled subject) is quite similar to that of FIG. 19. The FIG. 19 structure is notable in that it introduced the concept of kinetic modes or vibration modes peculiar to the position or vibration control of a mechanical system, into the field of temperature control. The interference between local temperature control systems may apparently be reduced with this structure. However, there still remain problems to be solved.

First of all, in the structure such as proposed in Japanese Laid-Open Patent Application No. 2000-187514, there is an implicit prerequisite condition that controlled systems to be temperature controlled must have substantially the same dynamic characteristics.

This will be explained in detail in conjunction with a case wherein the temperature control system for the controlled subject comprises dual-input and dual-output systems such as shown in FIG. 19. The transfer function matrix can be expressed as shown in FIG. 20. Here, how the elements of the transfer function matrix take a specific form differs in dependence upon what the temperature control system is just going to temperature-control. For example, when temperature control is to be carried out to an object having a uniform thickness by use of heaters disposed at two locations and on the basis of outputs of two temperature measuring means provided adjacent to the heaters, it can be expressed as follows.

$$G11(s)=G22(s)=[Kp/(1+Tp(s))]\exp(-Lp1(s)) \qquad (1)$$

Namely, transfer functions of diagonal elements are about the same. Of course, non-diagonal terms are proportional. Japanese Laid-Open Patent Application No. 2000-187514 supposes use of controlled systems as described above. Here, symbols used in equation (1) above can be readily understood by those skilled in the art. Therefore, a detailed description thereof will be omitted.

In the dual-input and dual-output system, if the parameters of G11(s) and G22(s) differ largely, it may be expressed by equations (2) and (3) below.

$$G_{11}(s)=[K_{p1}/(1+T_{p1s})]\exp(-L_{p1s}) \qquad (2)$$

$$G_{22}(s)=[K_{p2}/(1+T_{p2s})]\exp(-L_{p2s}) \qquad (3)$$

Of course, Kp1≠Kp2, Tp1≠Tp2 and Lp1≠Lp2. Namely, while the form of the transfer function itself is the same, values of the parameters differ largely, such that the responsibility differs. Alternatively, there may be a plant that can be expressed by equations (4) and (5) as follows.

$$G_{11}(s)=[K_{p1}/(1+T_{p1s})]\exp(-L_{p1s}) \qquad (4)$$

$$G_{22}(s)=[K_{p2}/\{(1+T_{p2s})(1+T'_{p2s})\}]\exp(-L_{p2s}) \qquad (5)$$

In this case, there is an essential difference in dynamics between G11(s) and G22(s), and there is a large difference in responsibility. Of course, in the cases of equations (2) to (5), elements 12 and 21 become interference terms, and, anyway, they treat an interference system in which a transfer function is present.

The air conditioning system in an exposure apparatus is a system that can be expressed by equations other than equation (1), that is, by equations (2) and (3) or, alternatively, by equations (4) and (5).

For example, the time constant of a system for controlling the whole space inside a thermostatic chamber at a constant temperature would be large. On the other hand, a system which is operated in parallel with the temperature control of a large space (as a thermostatic chamber) to perform local air conditioning only to a limited space of a stage, would be small in time constant and short in dead time. Namely, it is a quick response system. Of course, unless these parameters are small, there is no meaning of providing a local air conditioning system to a stage space, which is a very important space in relation to the exposure performance. As compared with the temperature control system for the thermostatic chamber space, this system accomplished higher responsibility of a re-heating heater, higher speed of blower means, and higher speed of temperature measuring means, thereby to assure quick responsibility. Anyway, the presence of disturbance in temperature control of the thermostatic chamber space leads to fluctuation in temperature of the stage space, and vice versa. Namely, the system is a mutually interfering system.

Even if the matrix elements of the mode temperature calculating means 520 and the distributing means 523 shown in FIG. 19 are incorporated as constant coefficients to a system in which the dynamics differ largely, such as described above, due to a large difference in dynamics involved, the non-interference system would not operate well.

Japanese Laid-Open Patent Application No. 2000-187514 refers to something other than matrix elements as constant coefficients. In fact, there is a statement "Although in this embodiment the distribution ratio (non-interference coefficient) is calculated by use of a transfer coefficient, as another embodiment, in place of the transfer coefficient, a transfer function, which represents the frequency characteristic may be used to calculate the same." This is a clear statement that the elements of the matrix operation are not limited to the constant coefficient. In other words, it means that the content of the distributing means can be determined while taking the dynamics of a controlled subject into consideration.

This operation may correspond to obtaining an inverse system, for example. However, it cannot be applied to a controlled subject including a dead time, such as a temperature control system. For, the inverse system of equation (1) can be expressed by the following equation.

$$G_{11}(s)^{-1}=[(1+T_{ps})/K_p]\exp(L_{ps}) \qquad (6)$$

Here, a state being not proper (problem of order) can be solved by insertion of a filter, which is effective to increase the order of the fraction. However, in the inverse system G11$^{-1}$, the dead time in $G_{11}(s)$ must function as a prediction time Lp, and this is impossible. This will be readily understood from that, since an unstable null point emerges in the numerator of a transfer function where the dead time is Hardy approximated, this null point becomes an unstable pole in the transfer function of the inverse system.

Alternatively, it may be contemplated that a physically attainable transfer function is incorporated as elements of the distributing means 523. However, an algorithm or a searching method for calculating such a transfer function has never been known. For theses reasons, it is practically impossible to incorporate elements having frequency characteristics to the elements of the distributing means 523.

The background of the present invention can be summarized as follows.

In the field of precise temperature control, conventionally, circulation air is once cooled and, thereafter, it is re-heated under temperature control. The re-heated air is fed into a space (temperature controlled space) where the temperature control is just to be done. The amount of re-heating the air depends on feedback control, which is based on an output of temperature measuring means. However, the temperature measuring means is not disposed in the space in which the temperature control should be done. In accordance with the concept that air of a desired temperature should be produced by a re-heating heater and it should be fed into the temperature control space, the temperature control of a chamber in an exposure apparatus, such as semiconductor exposure apparatus, has been carried out.

To the contrary, a temperature controlled space in an exposure apparatus is an environment attributable to the exposure performance and, therefore, any influence of an external disturbance should be reduced immediately. Nevertheless, feedback control based on a detected temperature of the temperature control space has never been carried out. This is because the dead time depending on the distance, for example, from the re-heating heater to the temperature measuring means will become longer and, therefore, stabilization of the control loop will become difficult to achieve.

Further, the external disturbance in the temperature control space will be detected with high sensitivity, and this will make the control loop settlement worse.

Further, in conventional temperature control systems for a thermostatic chamber in an exposure apparatus, a gas being controlled at a constant temperature is supplied from a blowing outlet port. Temperature measuring means is provided adjacent to the blowing outlet port, and the output thereof is fed back.

However, with such blowing outlet port temperature control, it is impossible to turn back the temperature of the space (to be controlled constant) promptly, under an external disturbance state. There is a concept of use point control in which, in addition to the blower outlet port, the temperature of a space just to be controlled at a constant temperature is detected and it is fed back. As compared with the blower outlet control, this method has a potential of turning back the temperature to a designated temperature promptly, against an external disturbance applied to the controlled space.

The actual operation of a thermostatic chamber of an exposure apparatus has to accept a large external disturbance, disturbing the temperature stability, such as by opening a door. With conventional blower outlet control, a change in external disturbance is not detected, and the supply of constant-temperature gas from the blowing outlet port continues. Therefore, the temperature control system operates continuously as usual. In the use point control, however, due to the application of a large external disturbance as by opening the door, it is possible that the temperature converting means continuously outputs a maximum value, for example. On such an occasion, the feedback system malfunctions and, in a worst case, the operation of thermostatic chamber stops. The stoppage of the chamber is a large obstruction to the continuous operation of the exposure apparatus and, therefore, it must be avoided. Further, in addition to avoiding the chamber stoppage, turning the chamber space back to a desired temperature promptly has been desired.

Further, in a thermostatic chamber of an exposure apparatus, the air conditioning process is carried out by use of a medium (in many cases, gas) of constant temperature. Specifically, a plurality of local air conditioning systems are operated in parallel to each other, to accomplish temperature control to a space directly concerning the exposure performance of the exposure apparatus as well as peripheral spaces communicated with that space. However, theses local air conditioning systems interfere with each other (interference system) and, because of such an interference feature, adjustment to improve the performance of the temperature control system as a whole is difficult to attain.

In order to avoid such an interference feature, Japanese Laid-Open Patent Application No. 2000-187514 proposes a non-interference system having superior controllability. However, in order to actually apply the proposed temperature control system to an exposure apparatus, there still remain large problems. Namely, in fact, there is a limitation that the controlled subjects to be treated by the proposed method should have substantially the same dynamics. As a result of this, it is practically impossible to insert a constant coefficient matrix operation into the feedback loop to avoid the interference feature.

Generally, temperature control systems operated in an exposure apparatus have inherently slow dynamics and yet they differ from each other. Thus, even if the proposed concept is applied simply to a temperature control system in an exposure apparatus, expected results would not be attainable. Moreover, since their dynamics differ from each other, prevention of interference itself may not function well.

SUMMARY OF THE INVENTION

It is accordingly an object of the present invention to provide a temperature adjusting system by which the precision of temperature control for a space where the temperature control is to be done can be improved, and also to provide an exposure apparatus having such a temperature adjusting system which can meet the requirements of improvements in precision and productivity of the exposure apparatus.

It is another object of the present invention to provide a temperature adjusting system to be operated in an exposure apparatus and having a function for switching a control loop structure in accordance with gas-tightness of a thermostatic chamber, for example, and also to provide an exposure apparatus having such a temperature adjusting system.

It is a further object of the present invention to provide a non-interference type temperature adjusting control system to be operated in an exposure apparatus and having plural local air conditioning systems operable in parallel to each other, by which high-speed response is accomplished and mutual interference is avoided or reduced, and also to provide an exposure apparatus having such a non-interference type temperature adjusting control system.

In accordance with an aspect of the present invention, there is provided a temperature adjusting system, comprising: a blowing outlet port for supplying a medium into a subject to be temperature controlled; first temperature measuring means for measuring a temperature at said blowing outlet port; a first temperature controller for performing a compensation operation in response to an output of said first temperature measuring means; second temperature measuring means for measuring a temperature of a temperature control space, which is downstream of said blowing outlet port; a second temperature controller for performing a compensation operation in response to an output of said second temperature measuring means; and temperature converting means for controlling an amount of heat generation on the basis of an output of said first temperature controller so that a medium being controlled at a constant temperature is supplied into said temperature control space from said blowing outlet port, wherein a predetermined temperature set value corresponding to a desired value for the temperature for the temperature control space is inputted to said second temperature controller, and wherein an output of said second temperature controller is inputted to said first temperature controller as a temperature set value for said first temperature controller.

In one preferred form of this aspect of the present invention, said first temperature controller is arranged to re-heat a medium once cooled and to supply a medium controlled at a constant temperature into said temperature control space.

A plurality of second temperature measuring means each being as aforesaid may be disposed in a distribution with respect to the temperature controlled subject, wherein said temperature adjusting means may further comprise operation means for calculating one of a simple average or a weighted average of a temperature measured value from outputs from said plurality of second temperature measuring means, and wherein an output of said operation means may be applied to said second temperature controller as negative feedback.

The temperature controlled subject may be at least one of a stage space in an exposure apparatus, a projection optical system and a booth for accommodating the exposure apparatus therein.

The first temperature controller may be based on a PID control method, while said second temperature controller may be based on a difference differential PID control method.

The temperature adjusting system may further comprise discriminating means for monitoring a stage in a temperature controlled thermostatic chamber and for discriminating the state inside said chamber on the basis of the monitoring, and switching means for changing an input of said first temperature controller between an output of said second temperature controller and the predetermined target value to said first temperature controller, on the basis of an output of said discriminating means.

The first temperature controller may be arranged to perform a PID operation while said second temperature controller may be arranged to perform a PI operation.

In accordance with another aspect of the present invention, there is provided a temperature adjusting system, comprising: a blowing outlet port for supplying a medium into a subject to be temperature controlled; first temperature measuring means for measuring a temperature adjacent to said blowing outlet port; a first temperature controller for performing negative feedback of an output of said first temperature measuring means; second temperature measuring means for measuring a temperature of a temperature control space, which is downstream of said blowing outlet port; a second temperature controller for performing negative feedback of an output of said second temperature measuring means; and temperature converting means for controlling an amount of heat generation on the basis of an output of said first temperature controller so that a medium being controlled at a constant temperature is supplied into said temperature control space from said blowing outlet port, wherein a predetermined temperature set value corresponding to a desired value for the temperature for said temperature control space is inputted to said second temperature controller, and wherein an output of said second temperature controller is inputted as a temperature set value for said first temperature controller.

In accordance with a further aspect of the present invention, there is provided a non-interference type temperature adjusting control system, comprising: temperature converting means for variably changing a temperature of a medium to be supplied into a controlled subject; a plurality of first temperature measuring means for measuring the temperature of the medium adjusted by said temperature converting means; a plurality of second temperature measuring means for measuring a temperature of the controlled subject; a minor loop system including a feedback system for actuating said temperature converting means on the basis of outputs of said first temperature measuring means; mode temperature calculating means for calculating an average temperature and a gradient temperature of the controlled subject on the basis of outputs of said first temperature measuring means; and distributing means for producing an output to said minor loop system in response to a signal obtainable by compensation to an output of said mode temperature calculating means.

In one preferred form of this aspect of the present invention, said minor loop system includes PID control means for determining a control input to said temperature converting means in response to an output of said second temperature measuring means and to a signal obtainable by performing compensation to an output of said mode temperature calculating means, and wherein said PID control means includes adjusting means for adjusting a response up to said first temperature measuring means in said minor loop system.

In accordance with a yet further aspect of the present invention, there is provided an exposure apparatus, comprising: transferring means for transferring a pattern of an original onto a substrate; and a temperature adjusting system including (i) a blowing outlet port for supplying a medium into a subject to be temperature controlled, (ii) first temperature measuring means for measuring a temperature at said blowing outlet port, (iii) a first temperature controller for performing a compensation operation in response to an output of said first temperature measuring means, (iv) second temperature measuring means for measuring a temperature of a temperature control space, which is downstream of said blowing outlet port, (v) a second temperature controller for performing a compensation operation in response to an output of said second temperature measuring means, and (vi) temperature converting means for controlling an amount of heat generation on the basis of an output of said first temperature controller so that a medium being controlled at a constant temperature is supplied into said temperature control space from said blowing outlet port, wherein a predetermined temperature set value corresponding to a desired value for the temperature for said temperature control space is inputted to said second temperature controller, and wherein an output of said second temperature controller is inputted to said first temperature controller as a temperature set value for said first temperature controller.

In accordance with a still further aspect of the present invention, there is provided an exposure apparatus, comprising: transferring means for transferring a pattern of an original onto a substrate; and a non-interference type temperature adjusting control system including (i) temperature converting means for variably changing a temperature of a medium to be supplied into a controlled subject, (ii) a plurality of first temperature measuring means for measuring the temperature of the medium adjusted by said temperature converting means, (iii) a plurality of second temperature measuring means for measuring a temperature of the controlled subject, (iv) a minor loop system including a feedback system for actuating said temperature converting means on the basis of outputs of said first temperature measuring means, (v) mode temperature calculating means for calculating an average temperature and a gradient temperature of the controlled subject on the basis of outputs of said first temperature measuring means, and (vi) distributing means for producing an output to said minor loop system in response to a signal obtainable by compensation to an output of said mode temperature calculating means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A, 4B and 4C are waveform graphs for explaining experimental results concerning advantages of a third embodiment, wherein FIG. 4A shows characteristics with respect to time of step-like external disturbance applied, FIG. 4B shows characteristics with respect to time of blower outlet port temperature, and FIG. 4C shows characteristics with respect to time of use point temperature.

FIGS. 17A, 17B and 17C are graphs showing results of measurements made to conventional blower outlet control, wherein FIG. 17A shows a use point temperature, FIG. 17B shows a blowing outlet port temperature, and FIG. 17C shows an external disturbance source temperature.

FIGS. 18A, 18B and 18C are graphs showing results of measurements made to conventional use point control, wherein FIG. 18A shows a use point temperature, FIG. 18B shows a blowing outlet port temperature, and FIG. 18C shows an external disturbance source temperature.

FIG. 19 is a diagrammatic view for explaining a non-interference type temperature control system, wherein a conventional dual-input and dual-output temperature adjusting system is incorporated.

DESCRIPTION OF THE PREFERRED EMBODIMENTS

Preferred embodiments of the present invention will now be described with reference to the attached drawings.

First Embodiment

Figure 1:
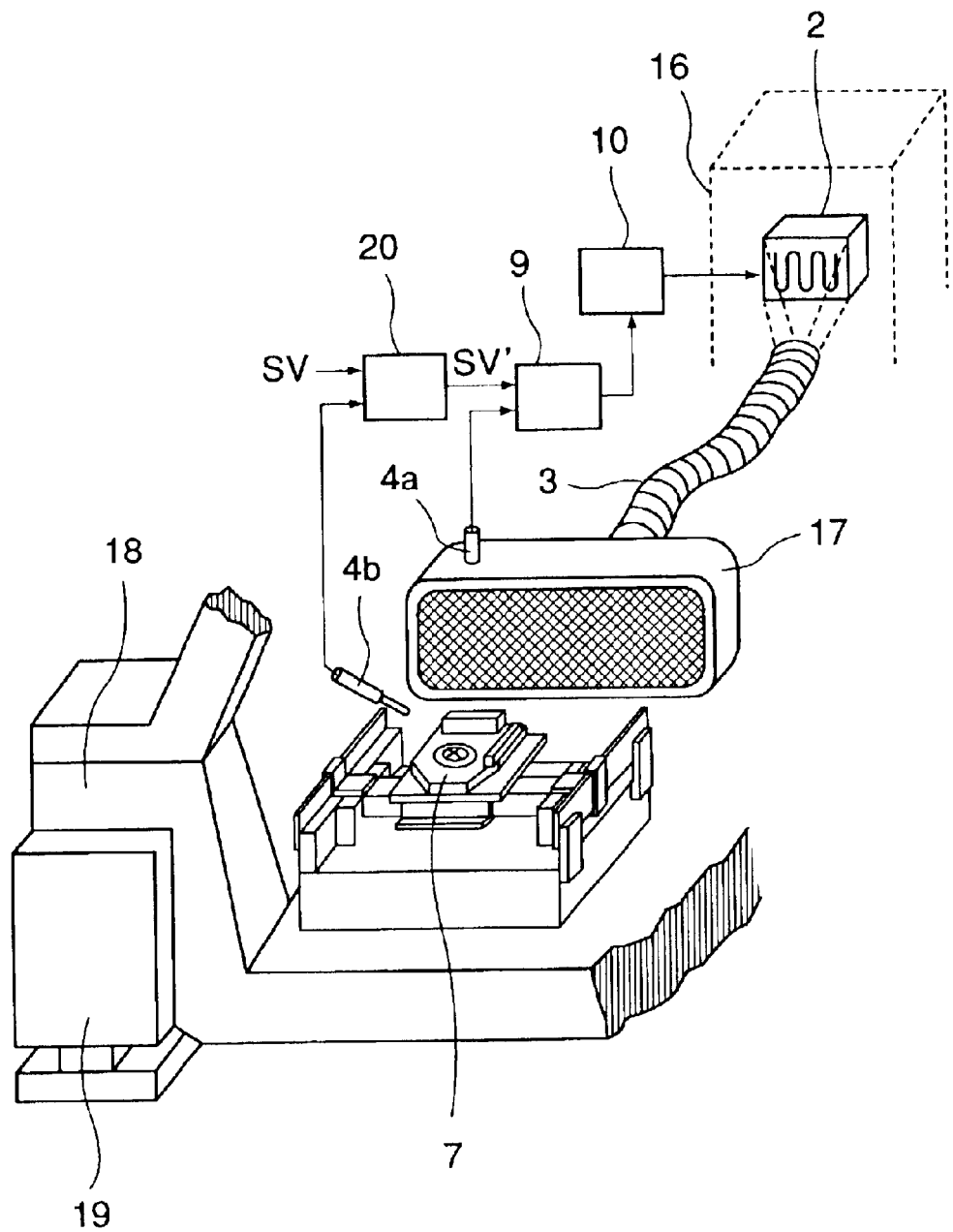
FIG. 1 is schematic view of a temperature adjusting system in a semiconductor exposure apparatus according to an embodiment of the present invention.
Figure 14:
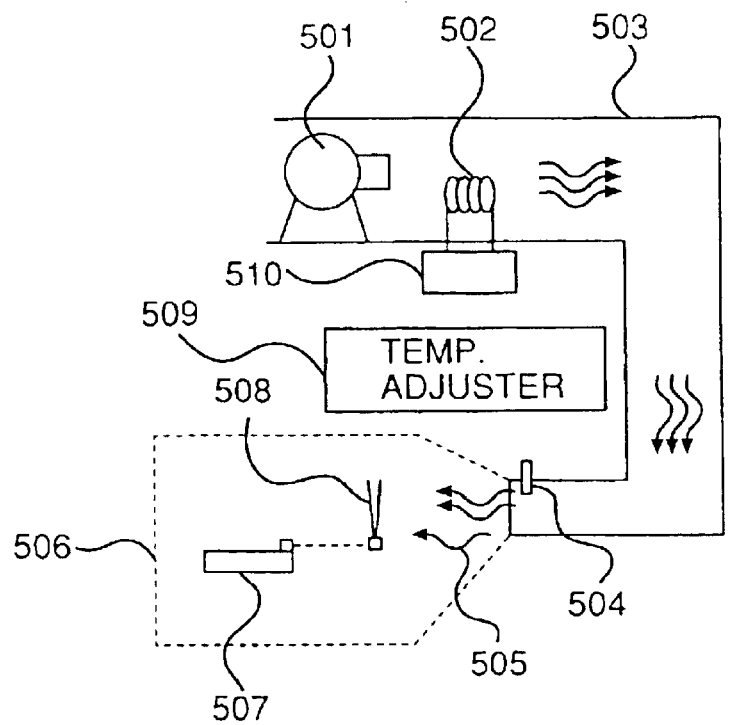
FIG. 14 is a diagrammatic view of a conventional temperature control system.
Figure 15:
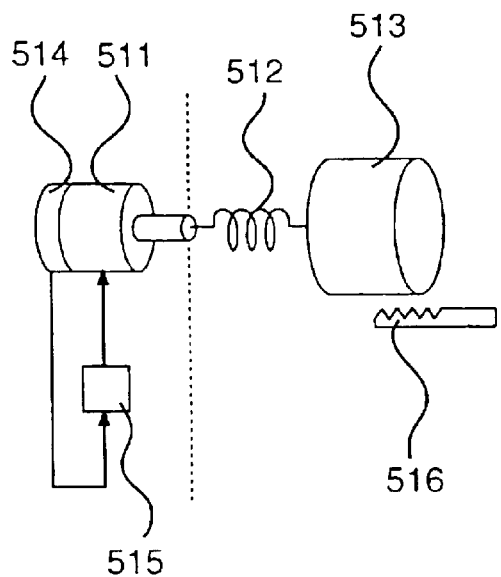
FIG. 15 is a schematic view of a control structure of a motor and load system in a conventional example.

FIG. 1 shows a temperature adjusting system according to a first embodiment of the present invention. Denoted in the drawing at 2 is a re-heating heater, which is disposed in an air conditioning machine chamber 16, for re-heating an air cooled by a cooling unit (not shown). Denoted at 3 is a duct for directing the re-heated air to a temperature controlled space. Denoted at 17 is a filter box as an air blowing outlet port, for supplying air into the temperature controlled space. Denoted at 4a is first temperature measuring means for measuring the temperature of air at the air blowing outlet port, and it may be the same as the temperature measuring means 504 shown in FIG. 14. Denoted at 9 is a first temperature controller for receiving an output of the first temperature measuring means 4a as a feedback signal, to perform a compensation operation. Denoted at 10 is a driver responsive to an output of the first temperature controller 9 to energize the re-heating heater 2. Denoted at 4b is second temperature measuring means for measuring the temperature of the temperature controlled space. Denoted at 20 is a second temperature controller for receiving an output of the second temperature measuring means 4b as a feedback signal, to perform a compensation operation. Denoted at 7 is a stage disposed inside the temperature controlled space, for carrying a semiconductor wafer thereon. Denoted at 18 is a main assembly structure, and denoted at 19 is an anti-vibration system, for supporting the main assembly structure 18.

In operation, an output of the first temperature measuring means 4a is applied to the first temperature controller 9. In this controller, a compensation operation is effected to a signal, which is obtainable by comparing an output of the first temperature measuring means 4a with a temperature set value SV' to be produced by the second temperature controller 20 to be described later. A corresponding compensation output is applied as an input to the driver 10 (e.g., SSR) for energizing the re-heating heater 2. On the other hand, the output of the second temperature measuring means 4b, which measures the temperature of the space for which the temperature control is just to be performed, is applied to the second temperature controller 20. A compensation operation is carried out there to a signal obtained by comparison with a temperature set value SV, whereby a temperature set value SV' to be inputted to the first temperature controller 9 is produced. The compensation operation by the first and second temperature controllers 9 and 20 is carried out by means of a PID compensator. It should be noted here that the response of the feedback loop using the first temperature controller 9 should be increased in advance so as to quickly follow the input of the temperature set value SV'. Specifically, a target value response centered adjustment will be preferable. The role of the feedback loop using the second temperature controller 20 is to maintain a certain temperature set value SV under the presence of external disturbance. Therefore, external disturbance response centered adjustment will be preferable.

The reason why the adjustment rules concerning target value response centered adjustment and external disturbance centered adjustment should be applied to the first and second temperature controllers 9 and 20, respectively, is that the target value response and the external disturbance response are in a trade-off relation. More specifically, as is well known in the art, there is a relationship that, if the PID compensation parameters are adjusted so as to improve the target value response, the external disturbance response is degraded, whereas if the PID compensation parameters are adjusted so as to improve the external disturbance response, the target value response is degraded. Reviewing the roles of the first and second temperature controllers 9 and 20 while taking into account the trade-off relation described above, it would be preferable to execute target value response centered PID parameter adjustment for the first temperature controller 9, and to execute external disturbance response centered PID parameter adjustment for the second temperature controller 20. Specifically, as regards the adjustment rules for target value response centered adjustment and external disturbance response adjustment, any one of the Ziegler-Nichols method, Takahashi method, Chien-Hrones-Reswick method, and the like, may be chosen appropriately.

In this embodiment, in addition to suitable selection of PID adjustment rules, the form of PID operations in the first and second temperature controllers 9 and 20 is specifically designated, to ensure the effects of the target value response centering and external disturbance response centering. First, as regards the second temperature controller 20, since, in this controller, the constant-level controllability for maintaining a temperature set value SV under the presence of external disturbance is regarded, a difference differentiation type PID control method as can be expressed by equation (7) below, for example, may be preferable.

$$\text{OUT}=(100/P)e+(1/Ti)\int edt+Td(d/dt)e \quad (7)$$

where OUT is an output of the compensator, e is a difference (e=PV−SV), PV is a temperature measured value, SV is a temperature set value, P is a proportional band, Ti is an integration time, and Td is a differentiation time.

As regards the first temperature controller 9, on the other hand, since a good followability to SV' is required in this controller, a differentiation precession type PID control method as can be expressed by equation (8) below, for example, may be preferable. In this PID control method, as compared with equation (7), the differentiation operation acts on the temperature measured value PV only.

$$\text{OUT}=(100/P)e+(1/Ti)\int edt+Td\Delta PV \quad (7)$$

where $\Delta PV=PV_n-PV_{n-1}$ (n−1 is a value at one control cycle before).

In this embodiment, as long as the target value response centering or external disturbance response centering is assured, the adjustment rules for the first and second temperature controllers 9 and 20 are not limited to the Ziegler-Nichols method or Takahashi method, etc.

Adjusting the PID parameters for the first and second temperature controllers 9 and 20 by trial and error so as to meet the property of the temperature controlled space is, of course, possible.

In FIG. 1, the second temperature measuring means 4b is illustrated as being above the stage 7 to detect the temperature of the space close to a semiconductor wafer. However, several alternatives are possible with regard to the structure of the second temperature detecting means 4b, as follows.

(1) Temperature measuring means is mounted so as to measure the object temperature of the stage 7, and this is taken as the second temperature measuring means 4b. The number of the second temperature measuring means 4b is not limited to one, and plural means may be used.

(2) Particularly, temperature measuring means is provided on the light path of a laser interferometer, which is provided as position measuring means for the stage 7, and this is taken as the second temperature measuring means 4b. The number of the second temperature measuring means 4b is not limited to one, and plural means may be used.

(3) Although only one second temperature measuring means 4b is disposed in FIG. 1, a plurality of second temperature measuring means 4b may be disposed spatially to measure temperature distribution. On the basis of the measurement result, a feedback signal to the second temperature controller 20 may be produced.

Second Embodiment

In the first embodiment described above, the temperature controlled space is a space, which accommodates the stage 7 for carrying thereon a substrate, such as a semiconductor wafer, and the temperature adjusting system functions to adjust this space at a predetermined temperature. The concept described is not limited to a space surrounding the stage 7, in an exposure apparatus. For example, it can be applied to a space in a booth inside a chamber where a projection exposure apparatus is housed.

Figure 16:
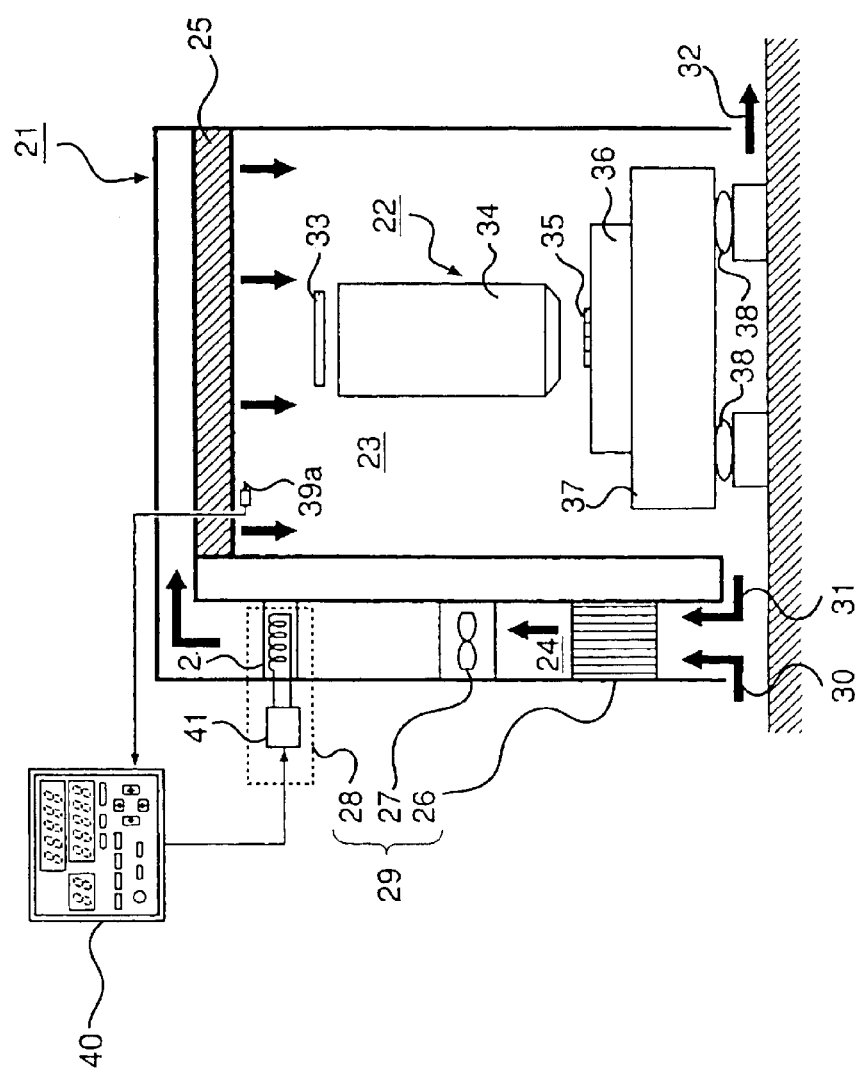
FIG. 16 is a schematic view of a conventional air conditioning system.
Figure 17A:
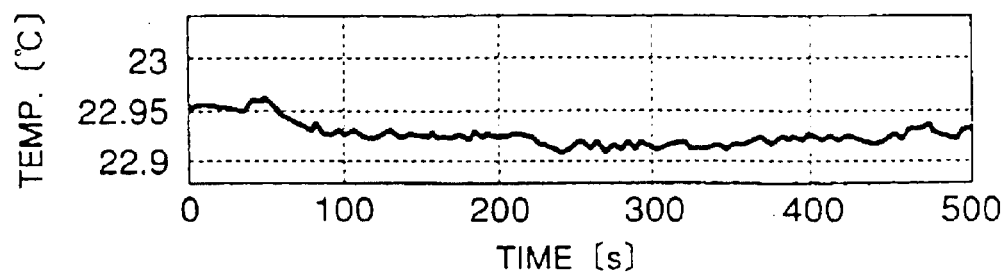
Figure 17B:
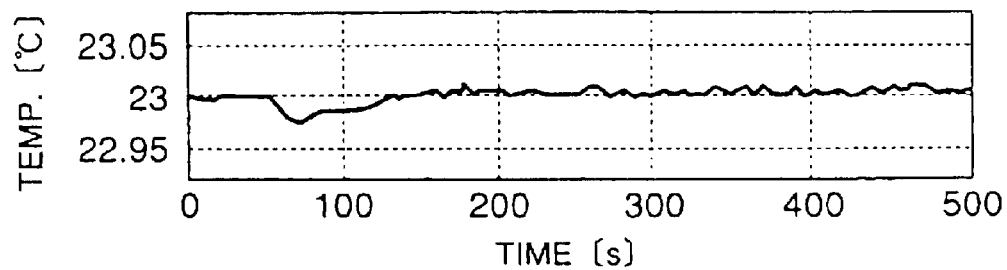
Figure 17C:
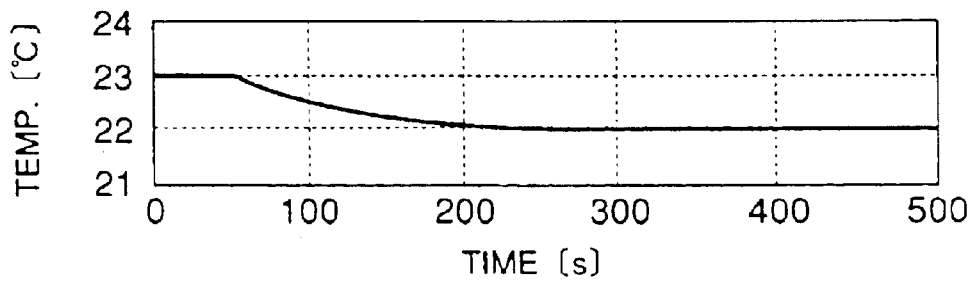
Figure 18A:
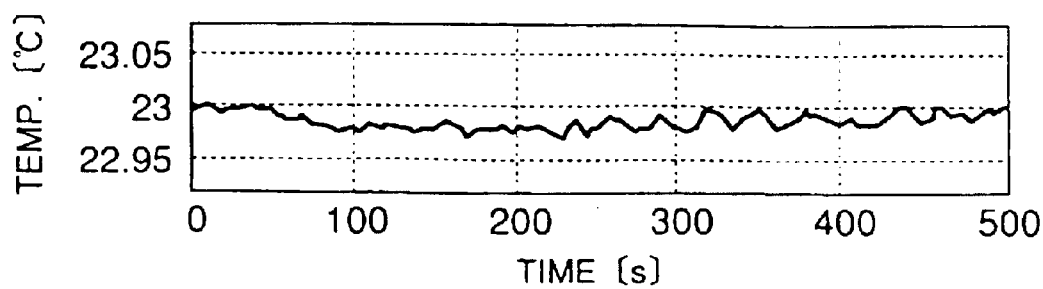
Figure 18B:
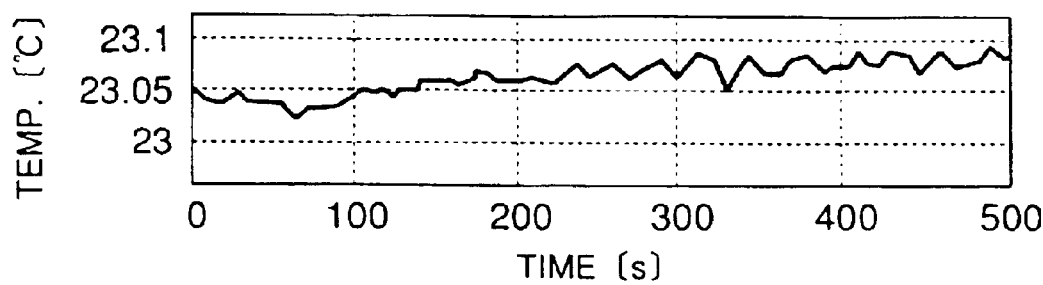
Figure 18C:
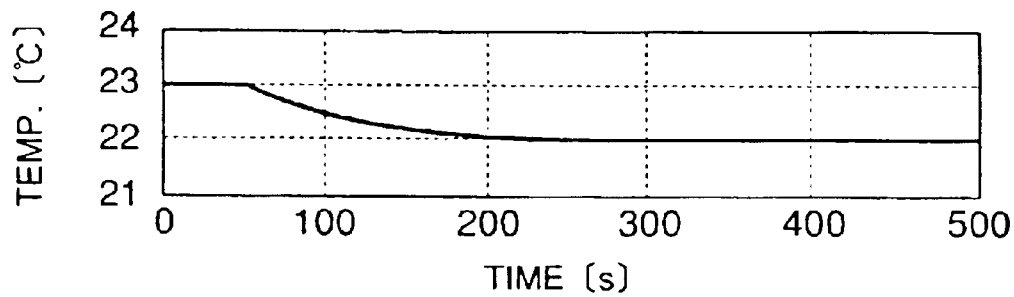
Figure 20:
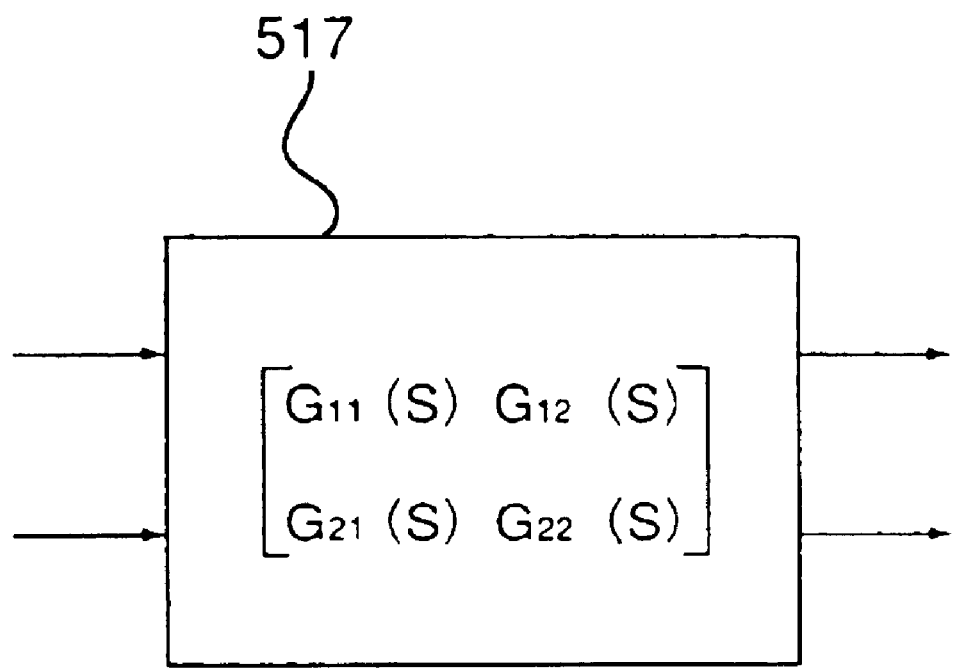
FIG. 20 shows a transfer function matrix in the case of FIG. 19.

In the structure shown in FIG. 16 described hereinbefore, the linewidth of an IC pattern to be printed on the wafer 35 is on the submicron order. In consideration of this, the projection exposure apparatus 22 should be isolated as much as possible from a temperature change influential to the exposure precision or from an environmental change due to dust particles in the air, for example. To this end, the exposure apparatus 22 is placed in a booth 23, which is equipped with an air conditioning system for keeping the air clean and at constant temperature. In order to maintain a constant temperature, air once cooled by a heat exchanger 26 is fed into a re-heating heater 28 by a blower 27, and the amount of re-heating is controlled. In regard to this re-heating amount, the temperature of the air, which down-flows from the filter 25, is detected by the first temperature measuring means 39a, and the detection output is applied to the temperature controller 40. The controller 40 compares it with a predetermined temperature target value for the booth 23, and a compensation operation is carried out. In most cases, it is PID compensation, and a compensation output is applied as an input to the driver 41 of the re-heater 28. In this structure, therefore, on the basis of a detection output related to only a single location close to the down-flow from the filter 25, the temperature of the booth 23 as a whole is controlled. However, the booth 23 has an enormous space and, yet, there are heat generating sources distributed spatially. Therefore, with the control of the re-heater 28 based on the temperature detection to a single location, precise temperature control is almost in failure.

Figure 2:
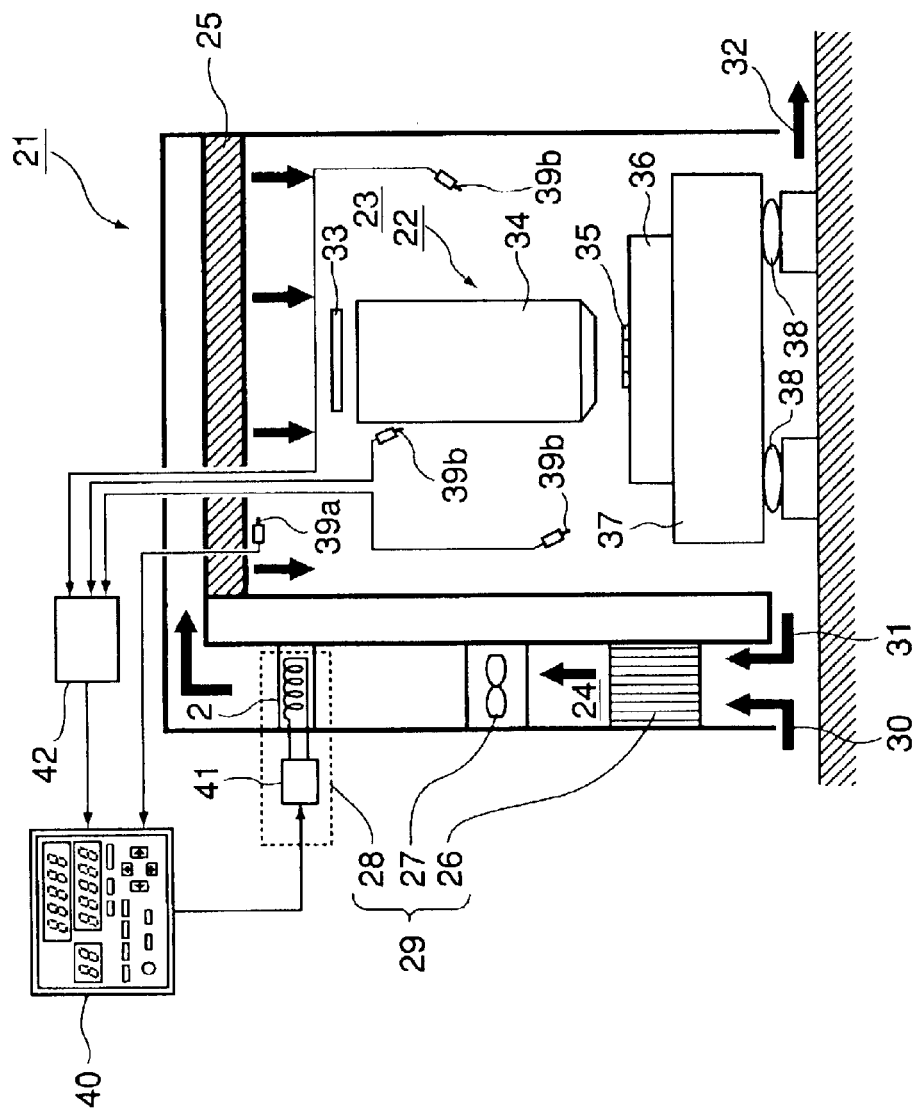
FIG. 2 is a schematic view of a temperature adjusting system according to an embodiment of the present invention.

FIG. 2 shows a temperature adjusting system according to a second embodiment of the present invention. Like numerals as those of FIG. 16 are assigned to corresponding elements.

In FIG. 2, first temperature measuring means 39a is provided adjacent to a filter 25 and, in addition to it, second temperature measuring means 39b (at three locations in FIG. 2) are disposed downstream of the down-flow. A plurality of outputs (three in FIG. 2) are applied to operation means 42. The operation means 42 functions to calculate a single temperature measured value from the outputs of the second temperature measuring means 39b, which are disposed spatially, and to feed back the same to the temperature controller 40. The operation to be made in the operation means 42 may be, for example, simple average calculation or weighted average calculation to temperature measured values corresponding to plural locations. Here, the weighted average calculation is such a process that a temperature measured value among the temperature measured values obtained at different locations by the second temperature measuring means 39b which has a strong correlation with the exposure performance is reflected strongly as a feedback signal to the temperature controller 40, whereas a temperature measured value which has a small correlation with the exposure performance is reflected lightly as a feedback signal to the temperature controller 40.

In this manner, the output of the operation means 42 is fed back to the temperature controller 40. Here, the temperature controller 40 functions so that the output of the operation means 42 follows up the temperature set value, being set in the temperature controller 40. More specifically, it operates to change quickly the temperature adjacent to the filter 25 as detected by the first temperature detecting means 39a, by controlling the re-heating heater 28 and also, as a result of down-flowing that air, the temperature at the location where the second temperature measuring means 39a is disposed is promptly brought into registration with the target temperature set in the temperature controller 40.

In FIG. 1, the first and second temperature controllers 9 and 20 are used, whereas in FIG. 2, only one temperature controller 40 is used. This controller 40 has a function of two-channel compensation operation or more, such that the functions of the first and second temperature controllers 9 and 20 of FIG. 1 are accomplished by this temperature controller 40.

The first embodiment described above is directed to a temperature adjusting system related to air conditioning to a space around a stage for carrying a semiconductor wafer thereon. The second embodiment described above is directed to a temperature adjusting system related to a booth for housing a semiconductor exposure apparatus therein. In semiconductor exposure apparatuses, temperature control is performed individually to a projection optical system and a driving unit for driving electromagnetic actuators, for example, where heat generation is outstanding. In this sense, the aggregation of temperature adjusting systems each performing local air conditioning may be called a temperature adjusting system in a semiconductor exposure apparatus. The concept of the present invention is, as a matter of course, applicable to a unit temperature adjusting system for local air conditioning.

Third Embodiment

Figure 3:
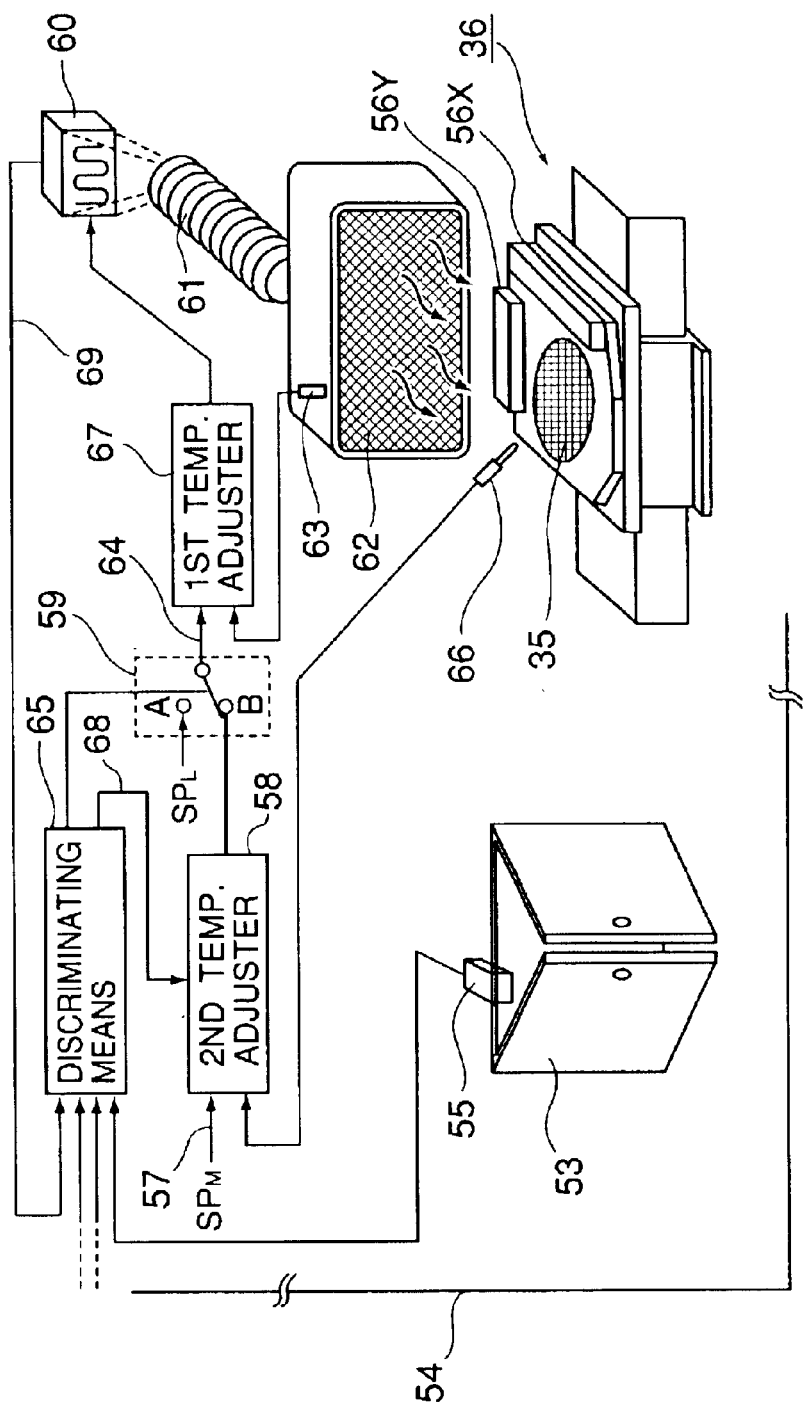
FIG. 3 is a schematic and diagrammatic view of a temperature adjusting system according to an embodiment of the present invention.

FIG. 3 shows a temperature adjusting system according to a third embodiment of the present invention. Denoted in FIG. 3 at 53 is an openable/closable door, and denoted at 54 is a portion of a partition wall of a thermostatic chamber to which the door 53 is attached. Denoted at 55 is an interlock switch of the door 53. In a space enclosed by the partition wall 54, an exposure apparatus 22, such as shown in FIG. 16, is accommodated. In FIG. 1, a portion of the wafer stage 36 as well as components around it, are illustrated. Mounted on the upper surface of the wafer stage 36 are a semiconductor wafer 35, and reflection mirrors 56X and 56Y for laser interferometers, which are provided for positioning and measurement.

The temperature control for the space of the wafer stage 36 is as follows. Denoted at 60 is a re-heating heater as temperature converting means, and denoted at 61 is duct for introducing the gas heated by the heater 60. Denoted at 62 is a filter for removing dust particles. There are first temperature measuring means 63 for measuring the temperature of the gas (arrows in the drawing) blown from the filter 62, and second temperature measuring means 66 for measuring the temperature adjacent to the wafer stage 36.

The output of the first temperature measuring means 63 is fed back to a first temperature controller 67 and, on the basis of an output of the first temperature controller 67, the heater 60 (temperature converting means) is actuated. In this embodiment, this closed loop system is called a "minor loop". On the other hand, the output of the second temperature measuring means 66 for measuring the temperature of the space around the wafer stage 36 is fed back to a second temperature controller 58. Here, the second temperature controller 58 functions to perform a PID operation to a deviation or differential signal obtainable by comparing a measured value of the second temperature measuring means 66 with a target value $SP_M$ applied to a target value input terminal 57. On the other hand, the first temperature controller 67 functions to perform a PD operation to a deviation or differential signal obtainable by comparing a measured value of the first temperature measuring means 63 with an output of the second temperature controller 58. The second temperature controller 58 preferably executes a PI operation with a D calculation omitted.

When the exposure apparatus is in a normal operation state, a change-over switch 59 is connected to side B, such that the output of the second temperature controller 58 is applied as an input to the minor loop described above. Namely, with respect to a differential signal obtainable by comparing the output of the second temperature controller 58 and the output of the first temperature measuring means 63, the control operation prepared in the first temperature controller 67 is executed. As compared with the minor loop described above, this closed loop constituted by the feedback of the second temperature measuring means 66 is called a "main loop". The combination of this main loop and the minor loop constitutes a use point control system.

When the exposure apparatus is in a normal operation state, the output of the second temperature controller 58 applies a command to the minor loop so that the temperature as measured by the second temperature measuring means 66 becomes registered with a target value $SP_M$. More specifically, the temperature of the gas blown from the filter 62 is adjusted by the minor loop, comprising the feedback of the output of the first temperature measuring means 63, so that the temperature of the space measured by the second measuring means 66 is converged to a value as designated by the target value $SP_M$.

The use point control described above can operate well as long as the exposure apparatus is in a normal operation state. That is, as regards the air conditioning such as shown in FIG. 3, if heat generation from actuators (not shown) produced as a result of positioning motion of the wafer stage 36 causes a change in temperature in this space, a gas of a temperature sufficient to cancel this temperature change is blown from the filter 62 (air blowing outlet port) to cancel the influence of the external disturbance. As a consequence, the temperature steadiness in the space, which is just to be temperature controlled, can be maintained.

The operation where the door 53 is opened, will be explained. The open/closed state of the door is detected by the interlock switch 55 as an ON/OFF, signal which is applied to the discriminating means 65. In response to an output of the discriminating means, the change-over switch 59 is connected to side A.

As regards the air conditioning operation, the output of the first temperature measuring means 3 is fed back to the first temperature controller 67, and the amount of heat generation by the heater 60 is controlled so that it is registered with the target value SP1 applied to the target value input terminal 64. The loop for feeding back the output of the second temperature measuring means 66 to the second temperature controller 58, that is, the main loop, is disconnected. Thus, the temperature change in the space measured by the second temperature measuring means 66 is left uncontrolled, and a gas of a temperature controlled to the target value SP1 is consistently blown from the filter 62. Although the temperature of the space of the wafer stage 36 is left as being deviated from the target value SPM due to the opening of the door 53, gases of a constant temperature are continuously and steadily blown from the filter 62.

As the door 53 is closed, the discriminating means senses a state signal from the interlock switch 55, and it causes the change-over switch 59 to be connected again to side B. Since the main loop is connected, the temperature of the gas to be blown from the filter 62 is controlled so that the temperature as detected by the second temperature measuring means 66 is registered with the target value $SP_M$.

Here, changing the change-over switch 59 from side A to side B needs special care. For, when the switch 59 is connected to side A, the output of the second temperature controller 58 is open, and a differential signal corresponding to a comparison signal between the target value SPM and the output of the second temperature measuring means 66 is continuously applied as an input to the second temperature controller 58. Since an integration circuit is included in it, as a result of that a differential signal not zero is continuously integrated, the output becomes excessive or saturated.

If in this state the switch 59 is connected to side B, the output of the second temperature controller 58 is applied at a blast to the input of the first temperature controller 67, to cause unnecessary temperature fluctuation consequently.

In order to avoid such a phenomenon, where the closed loop control, which is based on the output of the second temperature controller 58 is inactive, the output of the second temperature controller 58 may preferably be held at zero. A signal line 68 is a control line provided for this purpose. By means of this signal line 68, when the second temperature controller 58 is not used in the closed loop, a DC gain, for example, is made zero and, even though a finite differential signal is inputted, an output response to it is made zero.

In this embodiment, the change-over switch 59 is changed over in response to the opening/closing of the door 53. However, as an input to the discriminating means 65, a signal line other than the state signal from the interlock switch 55 may be connected.

In FIG. 3, there is a signal line 69 from the heater 60. If, for example, there occurs a large change in temperature inside the space measured by the second temperature measuring means 66, the re-heating heater 60 may be brought into a maximum heating state or a non-heating state. In such a case, in order to change over the switch 59, the state of the heater is detected and applied to the discriminating means 65, through the signal line 69. As another input, there may be an interlock switch other than the switch 55.

The function of the system shown in FIG. 3 is attainable by hardware or, alternatively, by software. At present, as a controller 58 or 67, many products having a major function of PID operation as well as functions of control loop switching, gain table switching, control state switching, and the like, are commercially available. Therefore, the system structure of FIG. 3 can be accomplished easily.

Figure 4A:
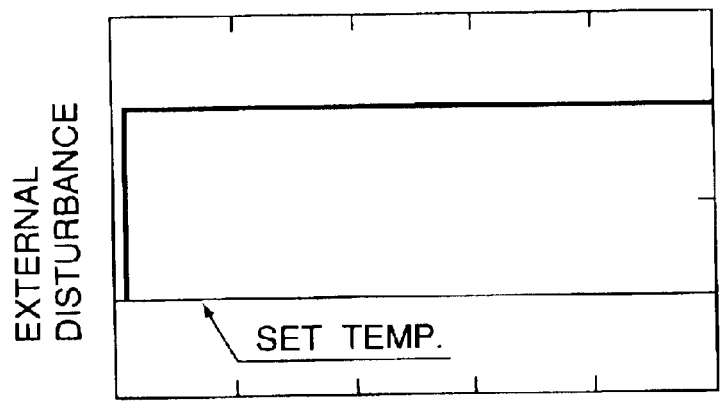
Figure 4B:
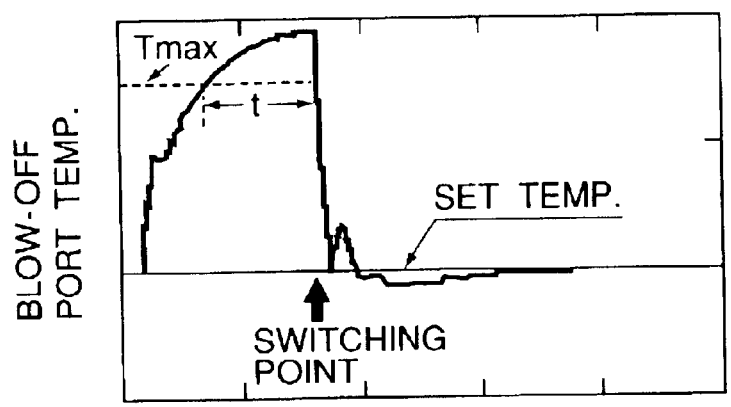
Figure 4C:
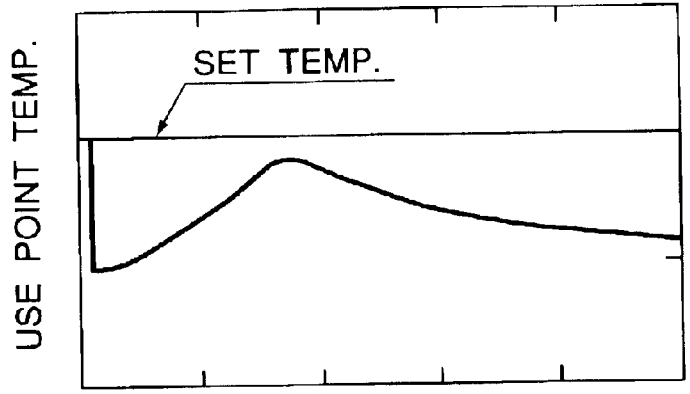

FIGS. 4A–4C show waveforms for explaining an example of numerical experiments, and they illustrate the advantageous effects of this embodiment. Specifically, FIG. 4A shows the characteristics with respect to time of a step-like external disturbance, FIG. 4B shows the characteristics with respect to time of the blowing outlet port temperature, and FIG. 4C shows the characteristics with respect to time of the use point temperature. In FIG. 4A, at the moment a step-like external disturbance enters the space of the use point in response to opening of the door 53, as shown in FIG. 4C, the temperature at the use point decreases stepwise due to the external disturbance. However, as shown in FIG. 4B, the temperature at the blowing outlet port gradually increases, and it functions to turn the use point space temperature back to the designated temperature.

However, in FIG. 4B, the output continues beyond the upper limit temperature Tmax for the gas from the gas blowing outlet port. If an output not lower than Tmax is produced continuously for a predetermined time t, in this embodiment, the change-over from the use point control to the blower outlet control occurs. In FIG. 4B, the control is switched at the moment of a thick upward arrow. Here, the blowing outlet port is converged toward a set temperature having been designated. On the other hand, as regards the use point temperature, before switching, the use point temperature shifted by the external disturbance was controlled so as to be turned to the set temperature. However, since the control for turning the space temperature back to the designated value has been discontinued, the temperature is directly influenced by the external disturbance and it is shifted again.

From the numerical experiments shown in FIGS. 4A–4C, it is seen that the function aimed at in this embodiment is accomplished well. In the numerical experiments of FIGS. 4A–4C, the condition for switching from the use point control to the blower outlet control is that "Tmax is reached and it continues for a time t". However, the mutual switching between the blower outlet control and the use point control is not limited to this condition. The switching may be done under the following conditions.

(1) In response to a state signal from an interlock switch, which is provided on the partition wall or the openable/closable door, representing that the gas tightness of the thermostatic chamber is broken, the use point control and the blower outlet control may be changed over immediately.

(2) The above-described state signal is used as a trigger and, by counting the duration time of such a state, the use point control and the blower outlet control may be changed over.

(3) When any disorder of the main loop in the use point control is detected, the control may be fixedly changed to the blower outlet control, while the operation of the exposure apparatus may be kept continued.

Fourth Embodiment

Figure 5:
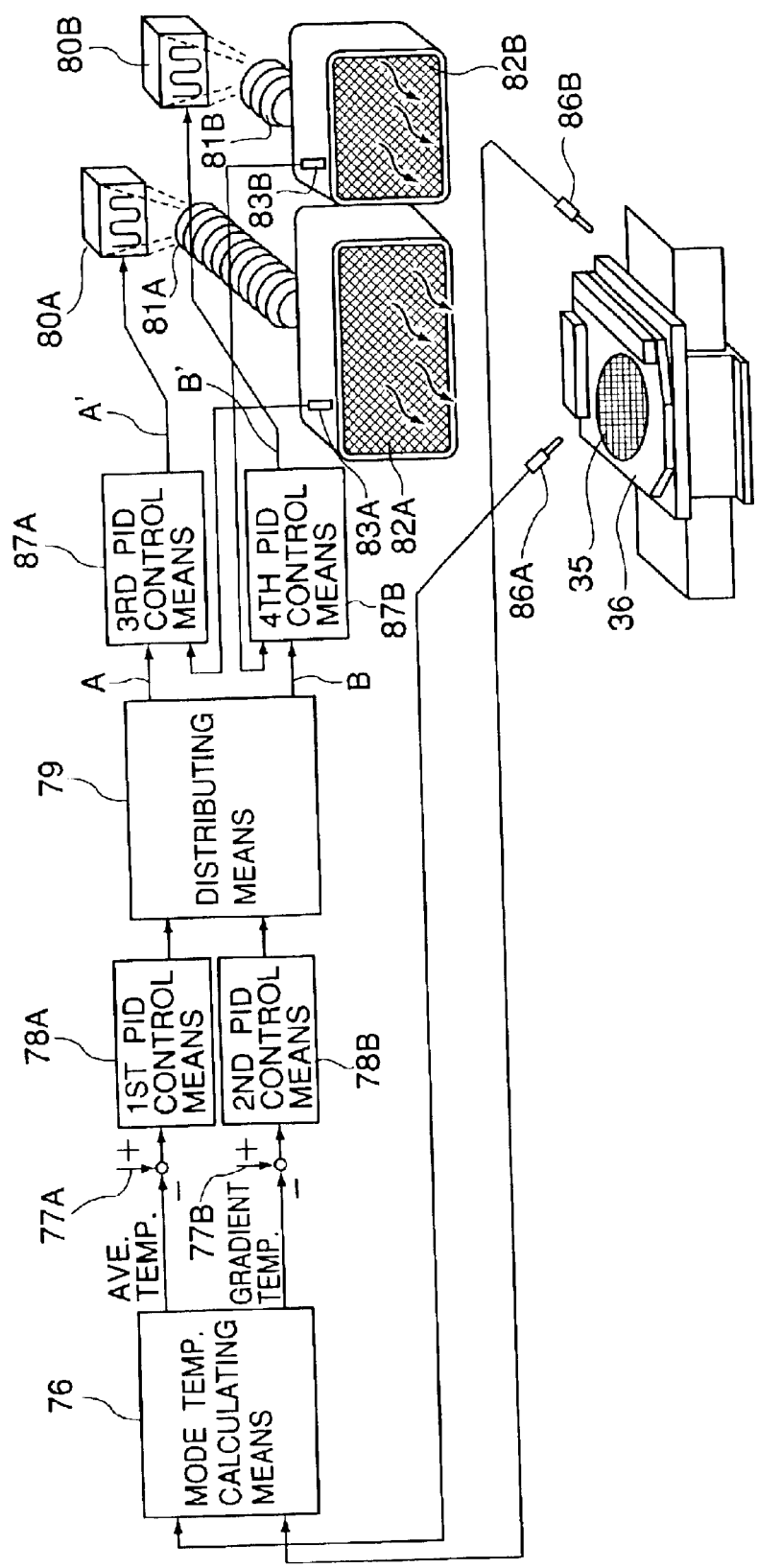
FIG. 5 is a schematic and diagrammatic view of a non-interference type temperature control system according to an embodiment of the present invention.

FIG. 5 shows a non-interference type temperature adjusting control system according to a fifth embodiment of the present invention. Denoted in the drawing at 80A and 80B are re-heating heaters, and denoted at 81A and 81B are ducts for introducing the re-heated air. Denoted at 82A and 82B are filters for removing dust particles or the like, and denoted at 83A and 83B are temperature measuring means. In FIG. 5, the air from the filter 82A (82B) is supplied to fill the space for a stage 36 carrying a semiconductor wafer 35 thereon, and a space in which a measurement laser beam of a laser interferometer provided for positioning the stage, so as to make the temperature therein constant.

Like the structure shown in FIG. 16, the semiconductor wafer 35 and the wafer stage 36 shown in FIG. 5 are disposed below a projection optical system 34. First temperature measuring means for measuring the temperature adjacent to the semiconductor wafer 35 is disposed below the projection optical system, and in FIG. 5 it is temperature measuring means 86A (86B). Further, in this embodiment, not only the temperature at the air outlet of the filter 82A (82B), the temperature of such a portion in which a constant temperature is just to be established is measured, and this is achieved by first temperature measuring means 86A (86B).

In FIG. 5, the output of the second temperature measuring means 83A (83B) for measuring the temperature of the gas blown from the filter 82A (82B) is fed back to the third or fourth PID control means 87A or 87B. In response, the third and fourth PID control means 87A and 87B produce outputs A' and B' and they are applied to the re-heating heaters 80A and 80B, respectively. Thus, with the second temperature measuring means 83A and 83B, the third and fourth PID control means 87A and 87B, and the re-heating heaters 80A and 80B, minor loops are defined, respectively.

With this minor loop, the transfer characteristic from the re-heating heater 80A (80B) to the second temperature measuring means 83A (83B) is improved. In other words, characteristics such as responsibility and non-linearity, for example, are improved.

More specifically, when a comparison is made with respect to the response from the inputs A and B to the second temperature measuring means 83A and 83B, between a case where a minor loop is defined and a case when no minor loop is defined, the response can be made faster in the former case. More exactly, by adjusting the third and fourth PID control means 87A and 87B appropriately, the response up to the temperature measuring means 83A and 83B with respect to the inputs A and B can be made faster. Also, by adjusting the third and fourth PID control means 87A and 87B, the response characteristics of them, that is, the dynamics, can be registered with each other.

In addition to it, that is, after constituting a minor loop system having its dynamics registered, the outputs of the first temperature measuring means 86A and 86B are applied to the mode temperature calculating means 76, and an average temperature and a gradient temperature are calculated.

Subsequently, the average temperature and the gradient temperature are compared with a value applied to a target value input terminal 77A related to average temperature and a value applied to another target value input terminal 77B related to gradient temperature, respectively. Thus, a differential signal concerning the average temperature and a differential signal concerning the gradient temperature are obtained.

The differential signal concerning the average temperature is applied to first PID control means 78A, while the differential signal concerning the gradient temperature is applied to second PID control means 78B, respectively, and compensation operation is carried out there. The outputs of the first and second PID control means 78A and 78B are applied to distributing means 79, for distributing these signals. Here, the first and second PID control means 78A and 78B, as well as the third and fourth PID control means 87A and 87B, are not limited to the PID operation. As long as a compensation function is provided, any means may be used appropriately.

The output signal of the distributing means 79 comprises signals A and B as inputs to be applied to the minor loops. As described hereinbefore, as regards the responsibility from the heater 80A (80B) to the first temperature measuring means 83A (83B), the dynamics can be improved by the minor loops including the third and fourth PID control means 87A and 87B and, in addition to it, the dynamics are made uniform. Therefore, by constituting the content of the distributing means 79 with a matrix of constant coefficients, temperature control with the interference avoided or reduced can be accomplished.

Fifth Embodiment

In the fourth embodiment described above, minor loops are constituted by directing the outputs of the first temperature measuring means 83A and 83B provided at the locations of the filters 82A and 82B to the third and fourth PID control means 87A and 87B, to thereby improve the dynamics of the air conditioning system from the heaters 80A and 80B through the ducts 81A and 81B up to the filters 82A and 82B. As described above, since the responsibility from the heaters 80A and 80B to the first temperature measuring means 83A and 83B is improved, an air conditioning system having an improved responsibility can be taken as a new controlled subject and an interference avoiding structure with respect to temperature can be arranged. Namely, the characteristic of the controlled subject is once shaped and, thereafter, interference avoiding arrangement is added. By this, an external disturbance suppression capacity can be improved and, also, the convergence speed can be made faster.

Figure 6:
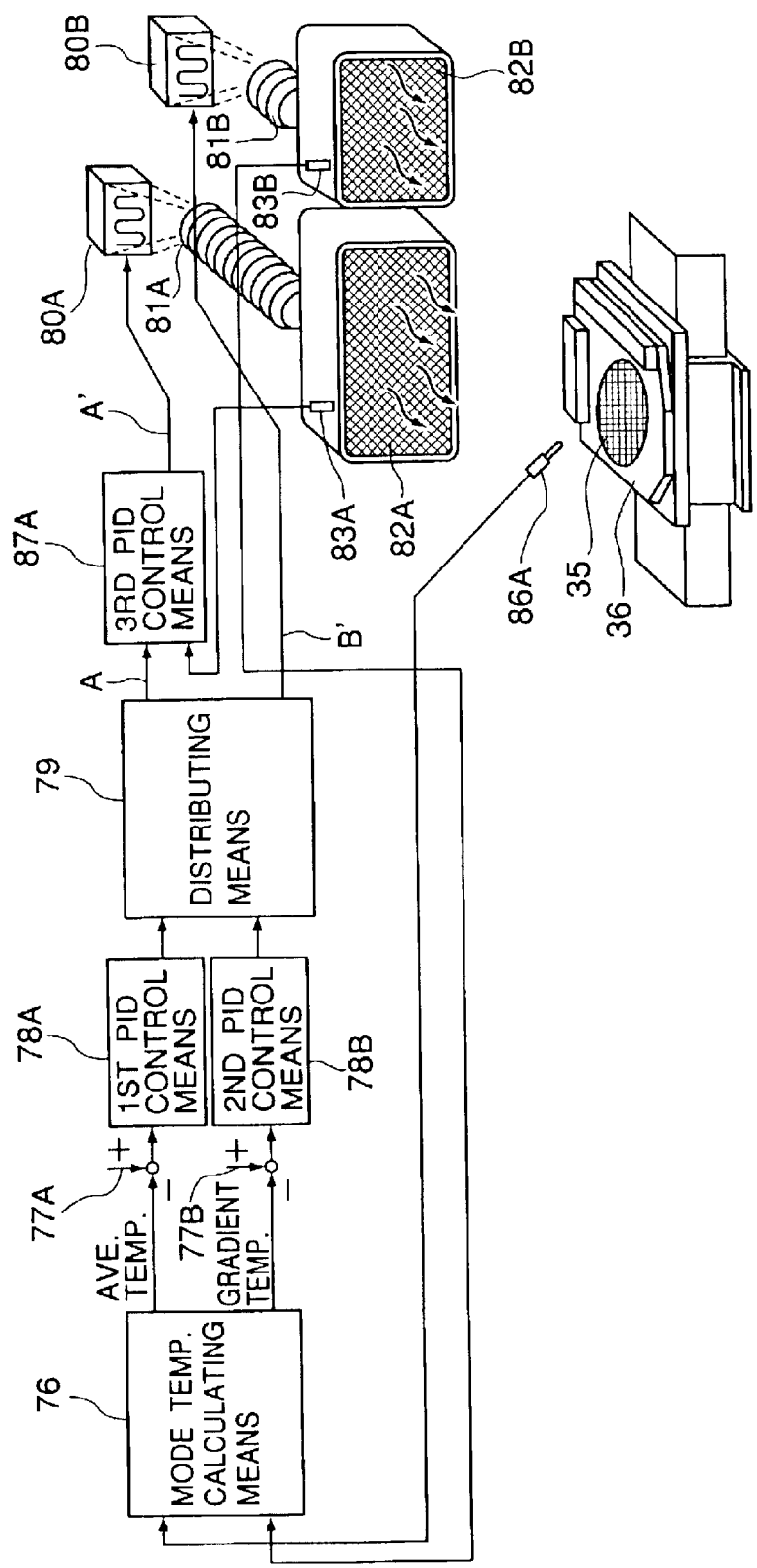
FIG. 6 is a schematic and diagrammatic view of a non-interference type temperature control system according to an embodiment of the present invention.

As described hereinbefore, the temperature control system of the type disclosed in aforementioned Japanese Laid-Open Patent Application No. 2000-187514 cannot be directly incorporated into a structure having plural temperature adjusting units having largely different dynamics. In order to solve this problem, it is possible that, rather than constituting the minor loop system for both of the two temperature adjusting systems as in the FIG. 5 embodiment, a minor loop system is structured to cause only a slow response temperature adjusting system to become close to a fast response temperature adjusting system. FIG. 6 shows an embodiment wherein this concept is applied to a temperature adjusting system of dual-input and dual-output of FIG. 5. Like numerals as those of FIG. 5 are assigned to corresponding elements.

In FIG. 6, due to a difference in length of the passageway, for example, from a re-heating heater 80A (80B) to a filter 82A (82B) through a duct 81A (81B), the air introduced through the duct 81A has slower dynamics as compared with the duct 81B. In other words, when the transfer characteristic from the input of a signal A to the temperature measuring means 83A with the transfer characteristic from the input of a signal B to the temperature measuring means 83B are compared with each other, the former shows a slower response characteristic.

In consideration of this, the transfer characteristic from the input A to the temperature measuring means 83A should be improved and also it should be made close to the transfer characteristic from the input B to the temperature measuring means 83B. To this end, the output of the temperature measuring means 83A is fed back to the third PID control means 87A, and the heater 80A is actuated on the basis of the output A' of the third PID control means 87A.

With this arrangement, the transfer characteristic from the input A to the temperature measuring means 83A can be improved as compared with the response from the input A to the temperature measuring means 83A. Preferably, it can be made substantially the same as the transfer characteristic from the input B to the temperature measuring means 83B.

By doing so, the transfer characteristic from the input A to the temperature measuring means 83A and the transfer characteristic from the input B to the temperature measuring means 83B can be made substantially equal to each other. Namely, their dynamics are registered with each other. Thus, for the dynamics having such registered characteristics, a non-interference type temperature adjusting control system having mode temperature calculating means 76 and the distributing means 79 can be structured.

FIGS. 7A, 7B, 8A and 8B show the results of numerical experiments, and they clarify the advantageous effects of this embodiment.

Figure 7A:
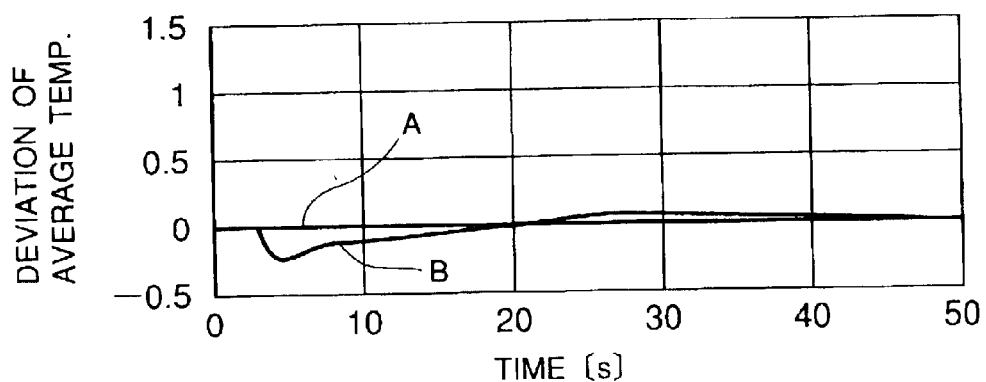
FIGS. 7A and 7B are graphs for explaining characteristics with respect to time of a difference between an average temperature and a gradient temperature, in a conventional example.
Figure 7B:
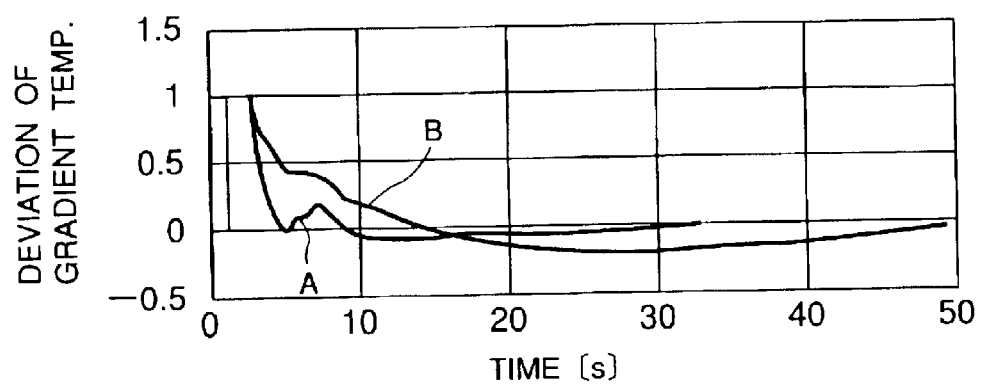
Figure 8A:
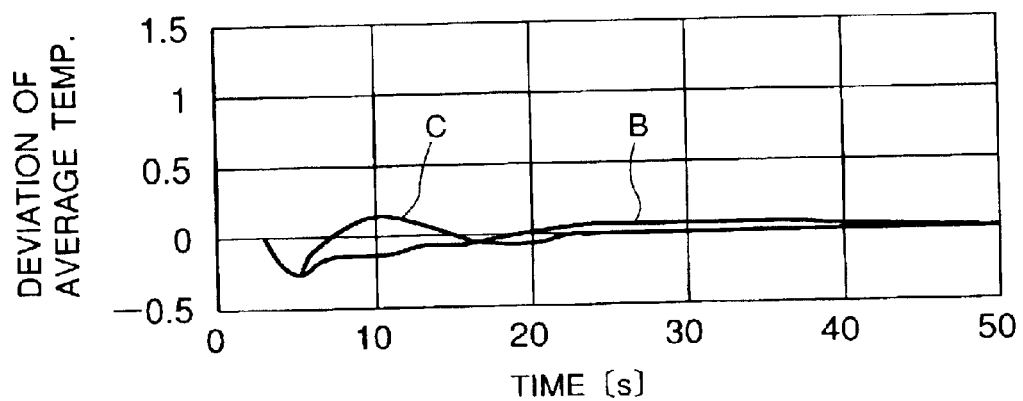
FIGS. 8A and 8B are graphs for explaining characteristics with respect to time of a difference between an average temperature and a gradient temperature, in an embodiment of the present invention.
Figure 8B:
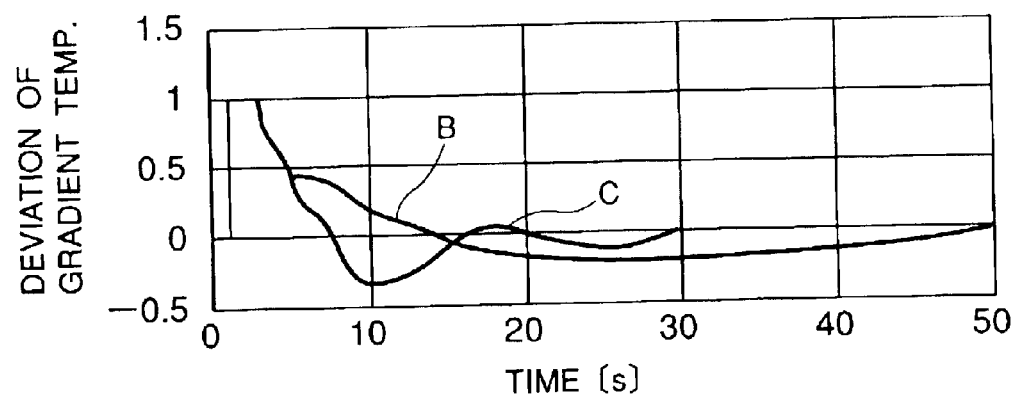

More specifically, FIGS. 7A and 7B show the characteristics with respect time of a difference or deviation in average temperature (FIG. 7A) and in gradient temperature (FIG. 7B), in a structure according to the aforementioned Japanese Laid-Open Patent Application No. 2000-187514. FIGS. 8A and 8B show the characteristics with respect to time of a difference or deviation in average temperature (FIG. 8A) and in gradient temperature (FIG. 8B), in a structure according to this embodiment. Here, a dual-input and dual-output system, such as shown in FIG. 19, is employed.

If a target value being stepwise with respect to the gradient temperature, for example, and having non-zero and non-diagonal elements and having diagonal element transfer functions of substantially the same dynamics, in terms of the transfer function matrix, is applied, a response such as shown by waveform A in FIG. 7A or 7B is produced. No response has occurred in the deviation signal err1 related to the average temperature. It is seen, therefore, that interference avoidance is accomplished.

Subsequently, a response shown at waveform B in FIG. 7A or 7B is, if the controlled subject is expressed in terms of a transfer function matrix, a response in a case wherein the dynamics of diagonal elements become large. In the response of waveform A, there is no response produced in the deviation signal err1 related to the average temperature. In the waveform B, however, since the dynamics differ from each other largely, a response emerges also in the deviation signal err1 related to the average temperature. Additionally, the deviation signal err2 related to the gradient temperature has a slow response.

It is seen from the observed phenomenon that, as regards the controlled subjects to be treated by the structure according to the aforementioned Japanese Laid-Open Patent Application No. 2000-187514, when expressed by a transfer function matrix, there is a definite limitation that the dynamics of diagonal components should be substantially the same with each other. If the dynamics differ largely from each other, the interference avoidance would be insufficient, and an expected operation would not work well.

On the other hand, when the present embodiment is applied to the controlled subject having a waveform B, a waveform C as shown in FIGS. 8A and 8B is obtainable. The waveform C is the result when, in addition to improving the delay of dynamics in the waveform B by a minor loop, an interference avoidance loop is structured. In response to a step input related to the gradient temperature, a differential signal related to the average temperature appears. Thus, while complete interference avoidance is not achieved, as compared with the waveform B, the response is well improved. Also, clearly, the convergence speed of the differential signal err2 related to the gradient temperature is improved.

FIGS. 5 and 6 each shows a system structure for temperature controlling the space adjacent to the semiconductor wafer 35. As a matter of course, the application of this embodiment is not limited to the temperature adjustment for a space near the semiconductor wafer 35. For example, the temperature adjusting system for the space near the wafer 35 and the temperature adjusting system for a space adjacent to a reticle 33 (FIG. 16) may have a system structure as shown in FIG. 5 or 6.

Further, the structure is not limited to a dual-input and dual-output system, such as shown in FIG. 5 or 6. For example, as shown in FIG. 16, the concept of this embodiment can be applied to three sites of (i) a temperature adjusting system for a space adjacent to a wafer 35, (ii) a temperature adjusting system for a space adjacent to a reticle 33, and (iii) a temperature adjusting system for a booth 23, namely, a triple-input and triple-output system. On that occasion, the mode temperature calculating means 76 and the distributing means 79 both perform triple-input and triple-output matrix operation. In order to improve the characteristic of a given temperature adjusting system, with respect to at least one adjusting system, a minor loop can be structured through the PID control means.

In the embodiment of FIGS. 5 and 6, in order to compensate for the delay in dynamics, temperature measuring means 83A and 83B are provided at the locations of filters 82A and 82B, and a minor loop in which the outputs of these temperature measuring means are fed back is prepared. However, the placement of such temperature measuring means is not limited to the air blowing outlet. They may be disposed just after the heaters 80A and 80B, respectively. Alternatively, temperature measuring means 83A and 83B may be disposed along the passage of the ducts 81A and 81B. What is necessary is that, through the feedback of the outputs of these temperature measuring means 83A and 83B, the heating operation speed of the heaters 80A and 80B can be improved.

Embodiment of A Semiconductor Manufacturing System

Next, an embodiment of a manufacturing system for manufacturing semiconductor devices, such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service, such as software supply, can be made by use of a computer network outside the manufacturing factory.

Figure 9:
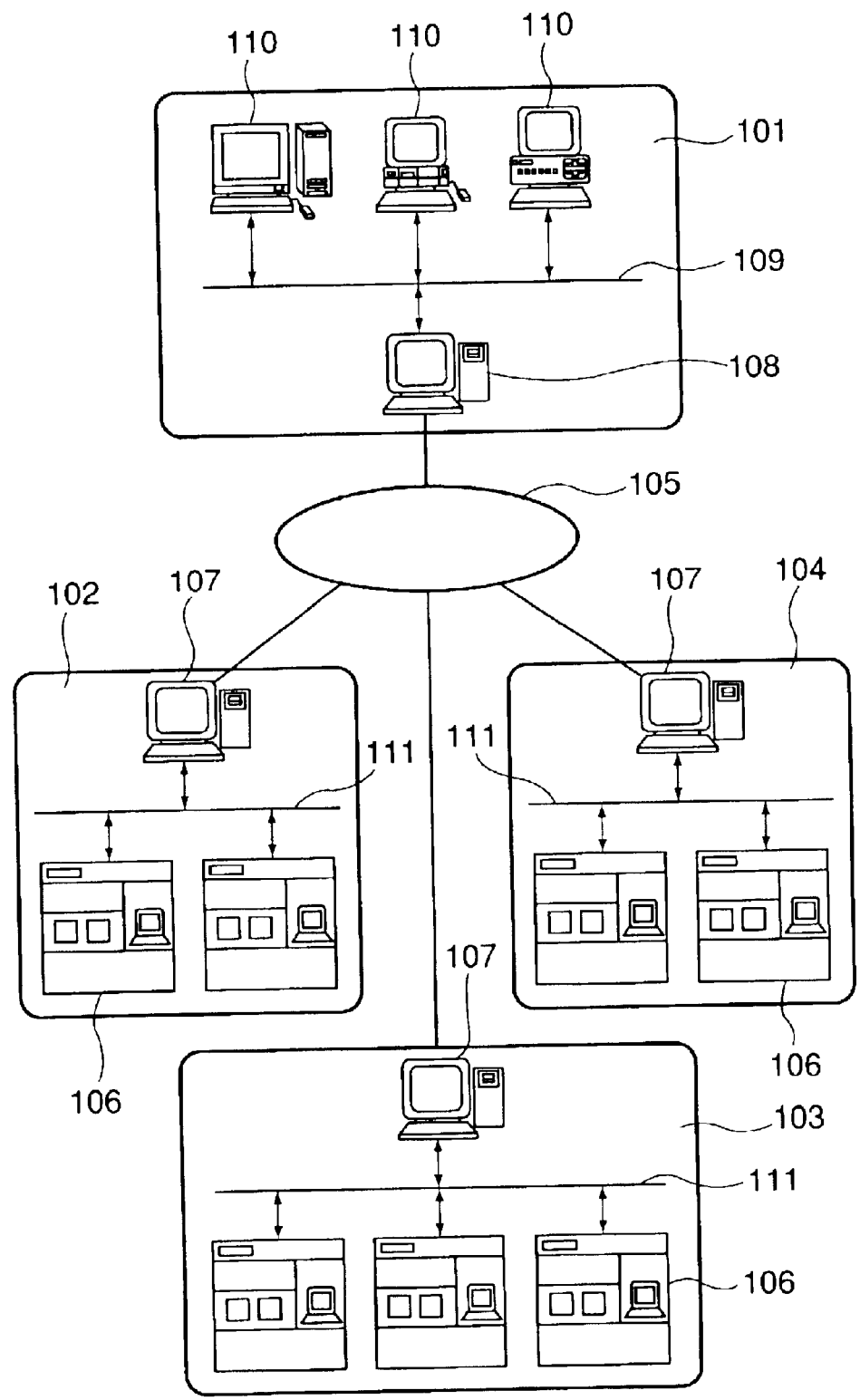
FIG. 9 is a schematic view of a semiconductor device manufacturing system including an exposure apparatus according to an embodiment of the present invention, as viewed in a certain aspect thereof.

FIG. 9 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (e.g., various lithographic apparatuses such as an exposure apparatus, a resist coating apparatus, an etching apparatus, for example, as well as a heat treatment apparatus, a film forming apparatus, and a flattening apparatus) and post-process machines (e.g., an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105, which is an outside network of the office, and a security function for restricting the access from the outside.

On the other hand, denoted at 102 - 104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105, which is an outside network of the factory. With this structure, the host control system 108 of the vendor 101 can be accessed from the LAN 111 in each factory, through the internet 105. Further, due to the security function of the host control system 108, only admitted users can access thereto. More specifically, through the internet 105, status information representing the state of operation of the production machines 106 (for example, the state of the machine in which any disorder has occurred) may be transmitted as a notice from the factory to the vendor. Additionally, any response information, which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., an ISDN) controlled with a strictest security that an access of a third party is not allowed, may be used. Further, the host control system is not limited to the system as provided by the vendor. A database may be structured by the user and it may be set in an outside network, such that it can be accessed from plural user factories.

Figure 10:
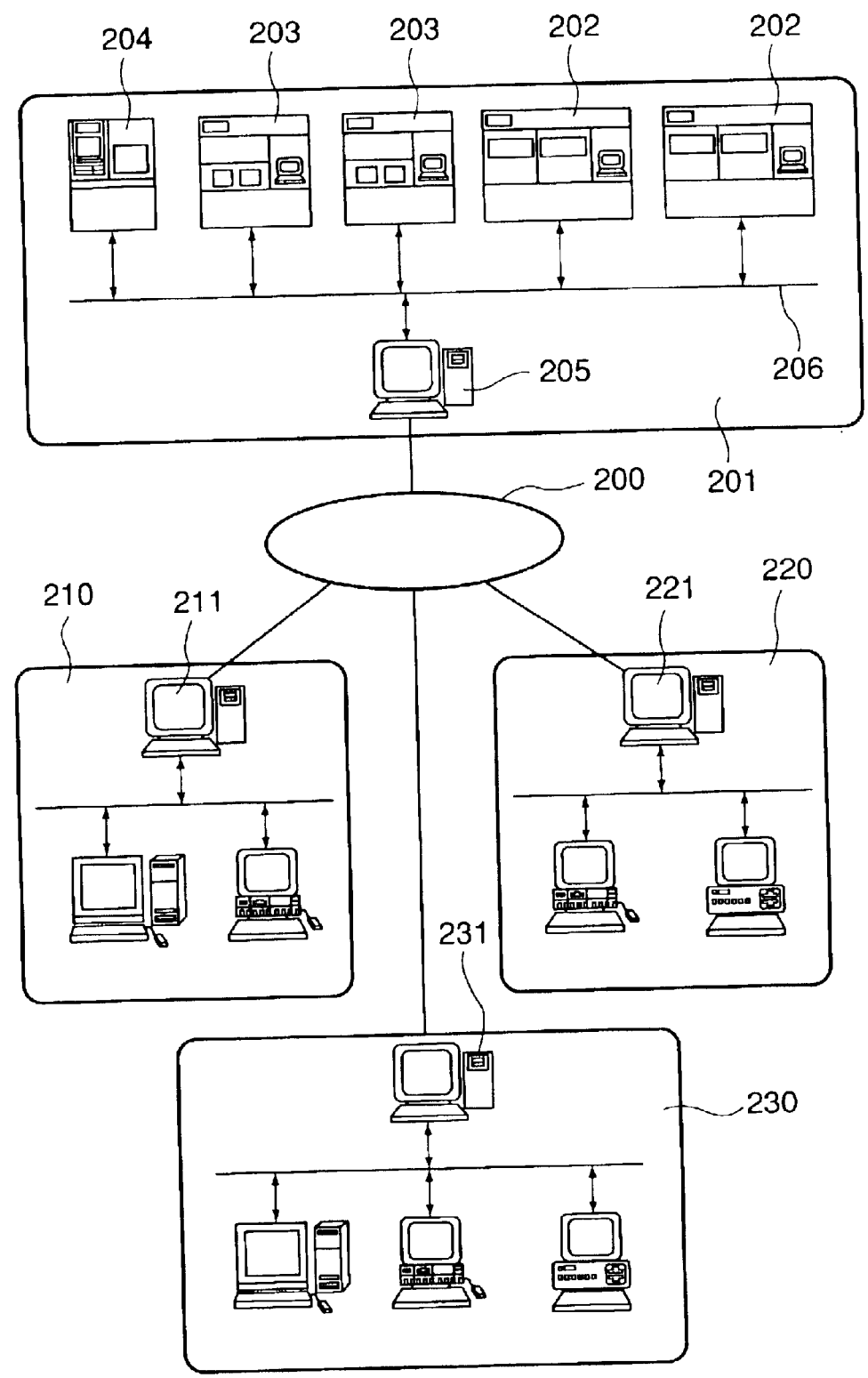
FIG. 10 is a schematic view of a semiconductor device manufacturing system including an exposure apparatus according to an embodiment of the present invention, as viewed in another aspect thereof.

FIG. 10 is a schematic view of a general structure of the production system according to this embodiment, in another aspect thereof different from that of FIG. 9. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 202, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 11:
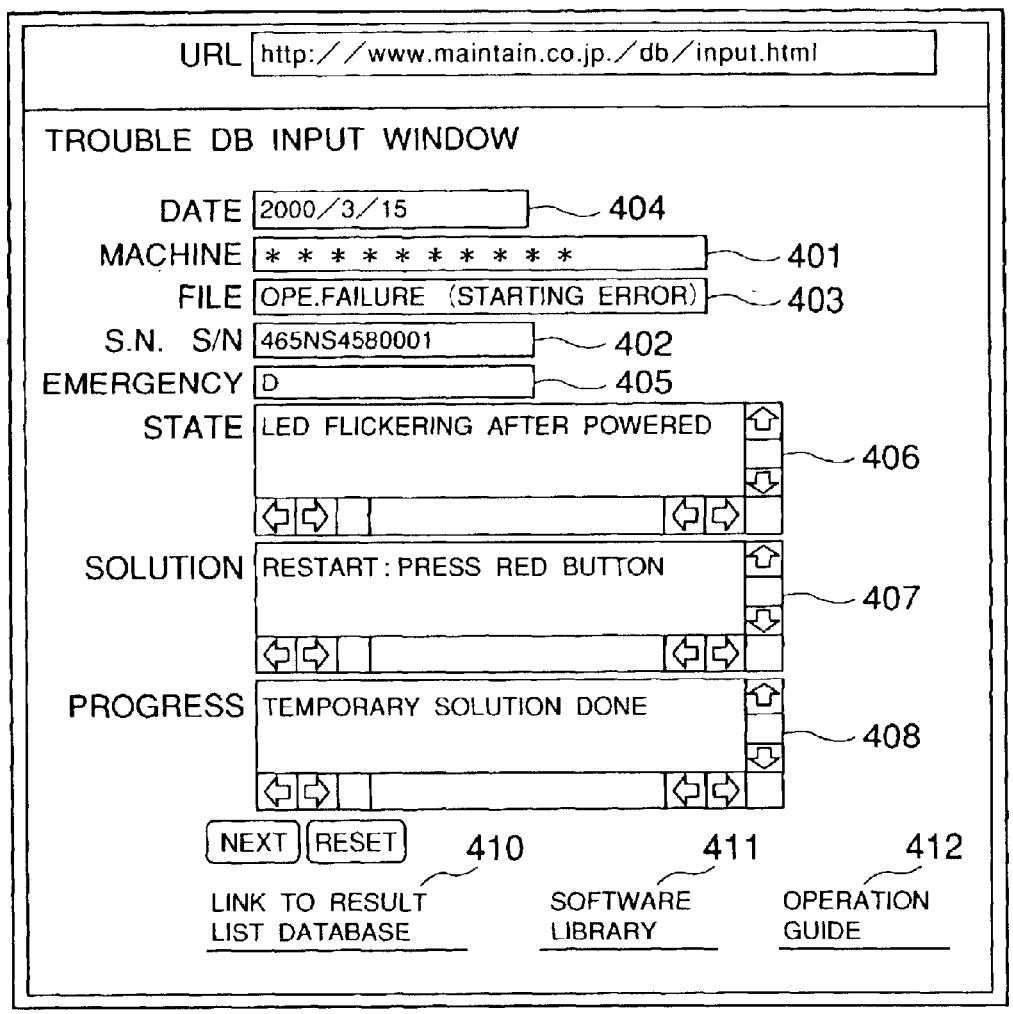
FIG. 11 is a schematic view for explaining an example of a user interface.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or a wide-use web browser, and a user screen interface, such as shown in FIG. 11, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each items, or he/she can get latest version software to be used for the production machine, from the software library as provided by the vendor. Alternatively, the operator can get an operation guide (help information) prepared for factory operators.

Next, a semiconductor device manufacturing process, which uses the production system described above, will be explained.

Figure 12:
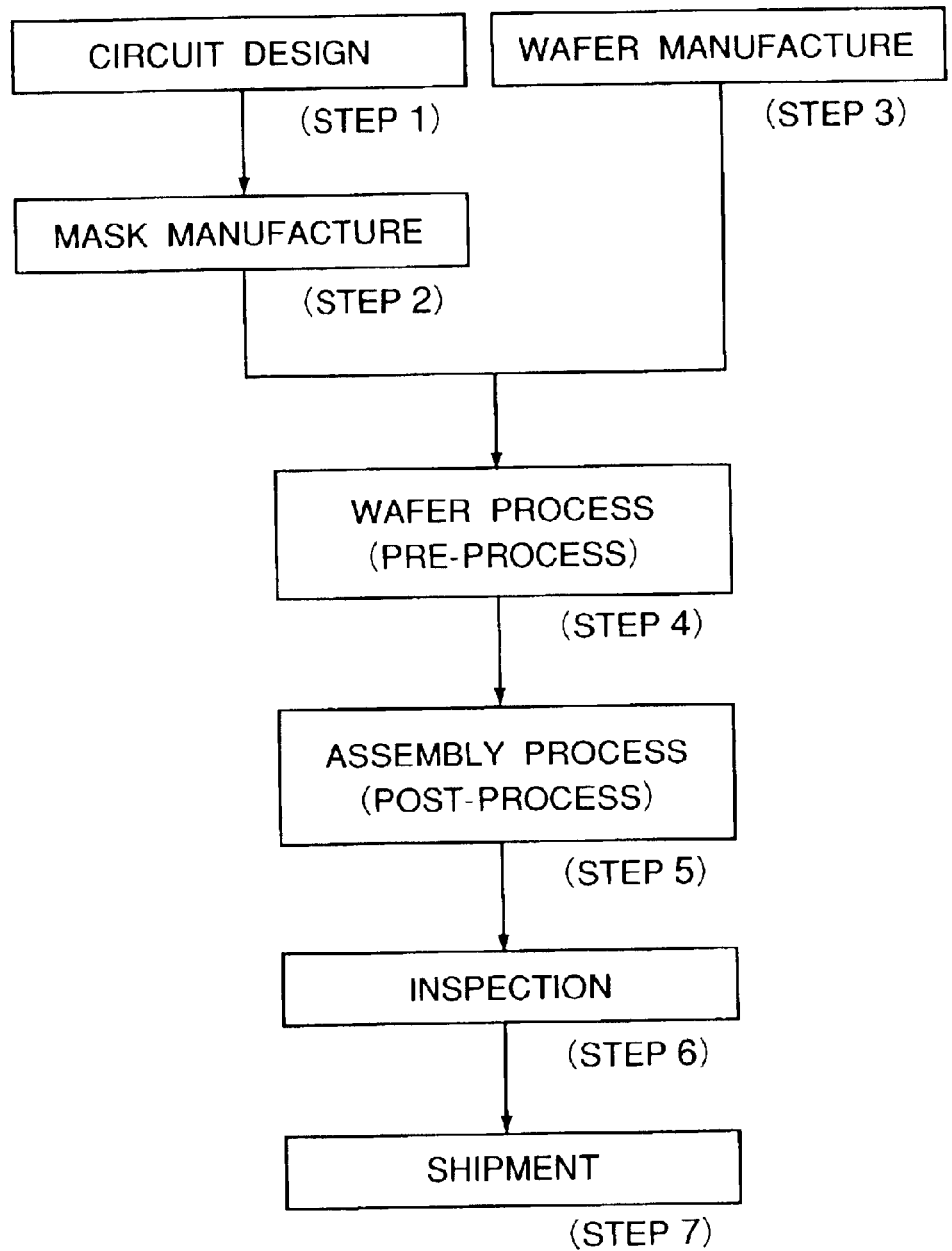
FIG. 12 is a flow chart of device manufacturing processes using an exposure apparatus according to an embodiment of the present invention.

FIG. 12 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process), wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 13:
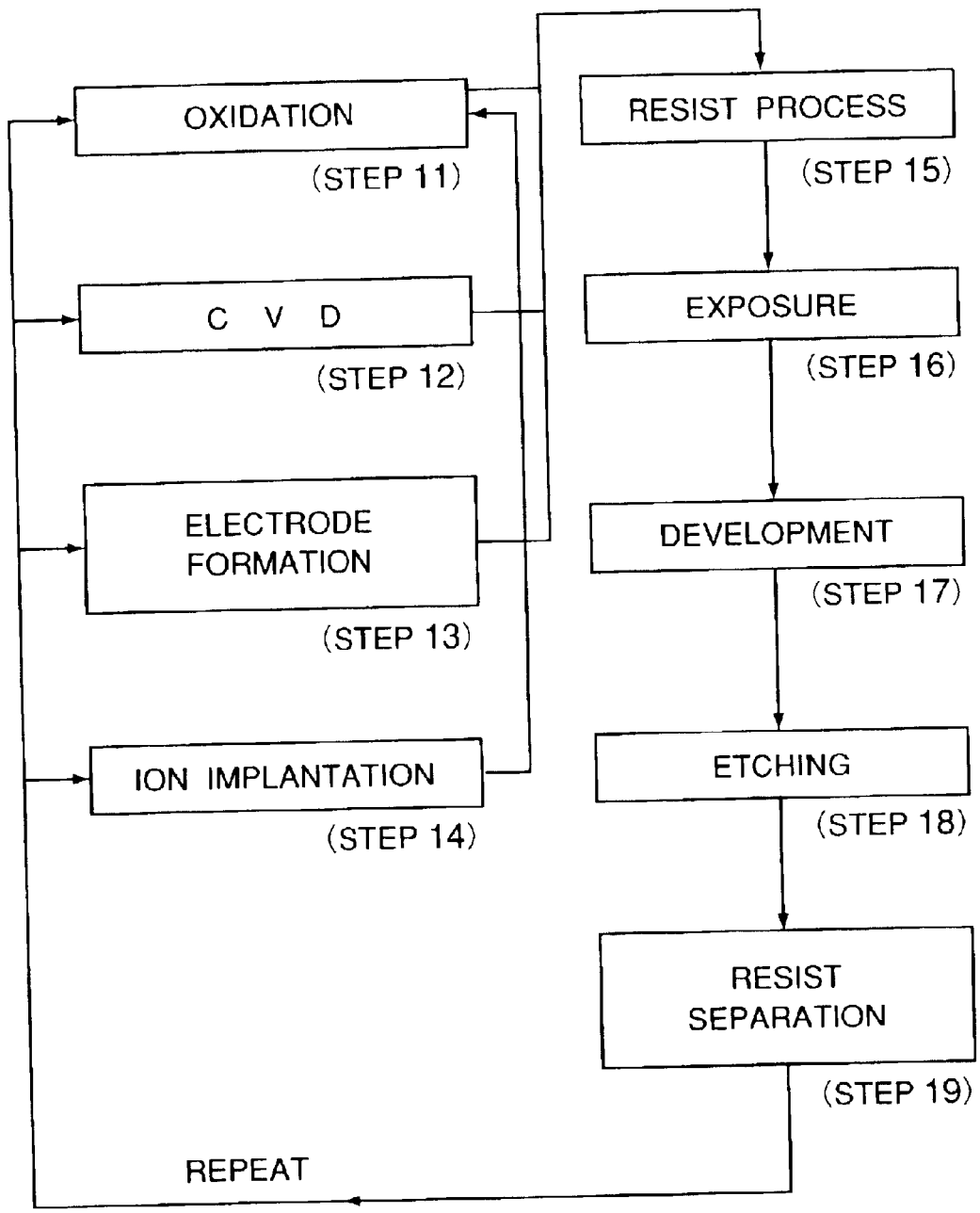
FIG. 13 is a flow chart for explaining details of a wafer process using an exposure apparatus according to an embodiment of the present invention.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the temperature adjusting system according to the present invention, a medium such as air, for example, stably temperature controlled at a blowing outlet port is blown into a subject of temperature adjustment, and additionally, the temperature of a temperature controlled spaced just to be controlled is measured by second temperature measuring means. Even if the temperature of this temperature controlled space changes due to external disturbance or the like, it is detected and, immediately, the temperature of the medium to be blown from the outlet is changed, such that the temperature controlled space can be adjusted at a predetermined temperature very precisely. Thus, with the present invention, a temperature adjusting system by which the temperature of a temperature controlled space can be controlled precisely even under external disturbance.

Conventionally, the air discharged from the blowing outlet port is structurally protected from being influenced by an external disturbance, by using a shield, for example. This requires additional cost. In the temperature adjusting system according to the present invention, the second temperature measuring means itself is taken as the subject of temperature adjustment, and a plurality of secondary temperature measuring means are disposed in distribution. Thus, a mechanical shield is unnecessary.

In a case of a thermostatic chamber in which use point control is provided, if an excessively large external disturbance occurs, compensative adjustment is discontinued. As a result, an undesirable state that the temperature converting means continuously produces outputs at the limit, can be avoided. Since, on that occasion, the blow control for blowing a constant temperature gas from the outlet port is kept, the thermostatic chamber can be operated continuously, without undesirable stoppage. Further, if the gas tightness is recovered thereafter, the use point control can re-start immediately. Therefore, an exposure enabled state is resumed in a space to be controlled at a constant temperature.

In a non-interference type temperature adjusting control system according to the present invention, dynamic characteristics of a plurality of controlled subjects, being operated in parallel to each other, are shaped by a minor loop system. The air conditioning system thus shaped is taken as a controlled subject, and an interference avoidance temperature adjusting control structure can be incorporated. This is very effective to improve the temperature adjusting performance.

When temperature adjusting systems having different dynamic characteristics are operated in parallel to each other, it is impossible to assure interference avoidance by use of a conventional non-interference type temperature adjusting system. In accordance with the present invention, the difference in dynamics is corrected by use of a minor loop. Therefore, a non-interference type temperature adjusting control system can be accomplished easily. The temperature adjusting performance can be improved. Also, since the interference feature is avoided, high speed response can be met. Thus, non-uniformness in the temperature distribution of the air conditioning systems operated in parallel can be removed, such that the recovering performance against the external disturbance can be improved.

When an exposure apparatus is equipped with a temperature adjusting system of the present invention, the improvements in temperature precision attained by the temperature adjusting system contributes well to the improvements in exposure precision and productivity of the exposure apparatus. Also, mechanical vibration, which might be produced as a result of the provision of a shield member or the like, as well as deterioration of the positioning precision due to such vibration, can be prevented.

When an exposure apparatus is equipped with a non-interference type temperature adjusting control system of the present invention, interference between air conditioning units operated in parallel can be avoided or reduced. This contributes not only to quality improvement of semiconductor devices to be produced, but also productivity improvement of the exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A temperature adjusting system, comprising:

a blowing outlet port for supplying a medium into a subject to be temperature controlled;

first temperature measuring means for measuring a temperature at said blowing outlet port;

a first temperature controller for performing compensation operation in response to an output of said first temperature measuring means;

second temperature measuring means for measuring a temperature of a temperature control space which is downstream of said blowing outlet port;

a second temperature controller for performing compensation operation in response to an output of said second temperature measuring means; and temperature converting means for controlling an amount of heat generation on the basis of an output of said first temperature controller so that a medium being controlled at a constant temperature is supplied into said temperature control space from said blowing outlet port;

wherein a predetermined temperature set value corresponding to a desired value for the temperature for said temperature control space is inputted to said second temperature controller, and wherein an output of said second temperature controller is inputted to said first temperature controller as a temperature set value for said first temperature controller.

2. A temperature adjusting system according to claim 1, wherein said first temperature controller is arranged to re-heat a medium once cooled and to supply a medium controlled at a constant temperature into said temperature control space.

3. A temperature adjusting system according to claim 1, wherein a plurality of second temperature measuring means each being as aforesaid is disposed in a distribution with respect to the temperature controlled subject, wherein said temperature adjusting means further comprises operation means for calculating one of a simple average or a weighted average of a temperature measured value from outputs from said plurality of second temperature measuring means, and wherein an output of said operation means is applied to said second temperature controller as negative feedback.

4. A temperature adjusting system according to claim 1, wherein the temperature controlled subject is at least one of a stage space in an exposure apparatus, a projection optical system and a booth for accommodating the exposure apparatus therein.

5. A temperature adjusting system according to claim 1, wherein said first temperature controller is based on a PID control method while said second temperature controller is based on a difference differential PID control method.

6. A temperature adjusting system according to claim 1, further comprising discriminating means for monitoring a stage in a temperature controlled thermostatic chamber and for discriminating the state inside said chamber on the basis of the monitoring, and switching means for changing an input of said first temperature controller between an output of said second temperature controller and the predetermined target value to said first temperature controller, on the basis of an output of said discriminating means.

7. A temperature adjusting system according to claim 4, wherein said first temperature controller is arranged to perform PID operation while said second temperature controller is arranged to perform PI operation.

8. A temperature adjusting system, comprising:
a blowing outlet port for supplying a medium into a subject to be temperature controlled;
first temperature measuring means for measuring a temperature adjacent said blowing outlet port;
a first temperature controller for performing negative feedback of an output of said first temperature measuring means;
second temperature measuring means for measuring a temperature of a temperature control space which is downstream of said blowing outlet port;
a second temperature controller for performing negative feedback of an output of said second temperature measuring means; and
temperature converting means for controlling an amount of heat generation on the basis of an output of said first temperature controller so that a medium being controlled at a constant temperature is supplied into said temperature control space from said blowing outlet port;
wherein a predetermined temperature set value corresponding to a desired value for the temperature for said temperature control space is inputted to said second temperature controller, and wherein an output of said second temperature controller is inputted as a temperature set value for said first temperature controller.

9. A non-interference type temperature adjusting control system, comprising:
temperature converting means for variably changing a temperature of a medium to be supplied into a controlled subject;
a plurality of first temperature measuring means for measuring the temperature of the medium adjusted by said temperature converting means;
a plurality of second temperature measuring means for measuring a temperature of the controlled subject;
a minor loop system including a feedback system for actuating said temperature converting means on the basis of outputs of said first temperature measuring means;
mode temperature calculating means for calculating an average temperature and a gradient temperature of the controlled subject on the basis of outputs of said first temperature measuring means; and
distributing means for producing an output to said minor loop system in response to a signal obtainable by compensation to an output of said mode temperature calculating means.

10. A non-interference type temperature adjusting control system according to claim 9, wherein said minor loop system includes PID control means for determining a control input to said temperature converting means in response to an output of said second temperature measuring means and to a signal obtainable by performing compensation to an output of said mode temperature calculating means, and wherein said PID control means includes adjusting means for adjusting response up to said first temperature measuring means in said minor loop system.

11. An exposure apparatus, comprising:
transferring means for transferring a pattern of an original onto a substrate; and
a temperature adjusting system including (i) a blowing outlet port for supplying a medium into a subject to be temperature controlled, (ii) first temperature measuring means for measuring a temperature at said blowing outlet port, (iii) a first temperature controller for performing compensation operation in response to an output of said first temperature measuring means, (iv) second temperature measuring means for measuring a temperature of a temperature control space which is downstream of said blowing outlet port, (v) a second temperature controller for performing compensation operation in response to an output of said second temperature measuring means, and (vi) temperature converting means for controlling an amount of heat generation on the basis of an output of said first temperature controller so that a medium being controlled at a constant temperature is supplied into said temperature control space from said blowing outlet port;
wherein a predetermined temperature set value corresponding to a desired value for the temperature for said temperature control space is inputted to said second temperature controller, and wherein an output of said second temperature controller is inputted to said first temperature controller as a temperature set value for said first temperature controller.

12. An exposure apparatus, comprising:

transferring means for transferring a pattern of an original onto a substrate; and a non-interference type temperature adjusting control system including (i) temperature converting means for variably changing a temperature of a medium to be supplied into a controlled subject, (ii) a plurality of first temperature measuring means for measuring the temperature of the medium adjusted by said temperature converting means, (iii) a plurality of second temperature measuring means for measuring a temperature of the controlled subject, (iv)

a minor loop system including a feedback system for actuating said temperature converting means on the basis of outputs of said first temperature measuring means, (v) mode temperature calculating means for calculating an average temperature and a gradient temperature of the controlled subject on the basis of outputs of said first temperature measuring means, and (vi) distributing means for producing an output to said minor loop system in response to a signal obtainable by compensation to an output of said mode temperature calculating means.

13. An apparatus according to claim 11 or 12, further comprising a display, a network interface and a computer for executing network software, wherein maintenance information related to said exposure apparatus is data communicated through the computer network.

14. An apparatus according to claim 13, wherein the network software provides on the display a user interface for accessing a maintenance database prepared by a vendor or a user of said exposure apparatus and connected to an external network outside a factory where said exposure apparatus is placed, thereby to enable obtaining information from the database through the external network.

15. A device manufacturing method, comprising the steps of:

providing a group of production machines for various processes, including an exposure apparatus as recited in claim 11 or 12, in a semiconductor manufacturing factory; and producing a semiconductor device through plural processes using the production machine group.

16. A method according to claim 15, further comprising (i) connecting the production machines of the group with each other through a local area network, and (ii) executing data-communication concerning information related to at least one production machine of the production machine group, between the local area network and an external network outside the semiconductor manufacturing factory.

17. A method according to claim 16, wherein a database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

18. A semiconductor manufacturing factory, comprising:

a group of production machines for various processes, including an exposure apparatus as recited in claim 11 or 12, in a semiconductor manufacturing factory;

a local area network for connecting the production machines of the production machine group with each other; and a gateway for enabling an access from the local area network to an external network outside the factory, wherein information related to at least one production machine in the group can be data communicated by use of the local area network and the gateway.

19. A method of executing maintenance for an exposure apparatus as recited in claim 11 or 12 and provided in a semiconductor manufacturing factory, said method comprising the steps of:

preparing, by a vendor or a user of the exposure apparatus, a maintenance database connected to an external network outside the semiconductor manufacturing factory;

admitting an access from the semiconductor manufacturing factory to the maintenance database through the external network; and transmitting maintenance information stored in the maintenance database to the semiconductor manufacturing factory through the external network.

* * * * *

UNITED STATES PATENT AND TRADEMARK OFFICE
CERTIFICATE OF CORRECTION

PATENT NO. : 6,809,300 B2
DATED : October 26, 2004
INVENTOR(S) : Shinji Wakui et al.

It is certified that error appears in the above-identified patent and that said Letters Patent is hereby corrected as shown below:

Column 15,
Line 43, the right margin should be closed up.
Line 44, the left margin should be closed up.

Column 23,
Line 8, "respect" should read -- respect to --.

Column 26,
Line 39, "items" should read -- item --.

Column 27,
Line 34, "spaced" should read -- space --.

Column 31,
Line 12, the right margin should be closed up.

Signed and Sealed this

Twenty-second Day of March, 2005

JON W. DUDAS
*Director of the United States Patent and Trademark Office*